US007755374B2

(12) United States Patent
Cojocneanu et al.

(10) Patent No.: US 7,755,374 B2
(45) Date of Patent: Jul. 13, 2010

(54) APPARATUS AND METHOD FOR TESTING SEMICONDUCTOR DEVICES

(76) Inventors: Christian O. Cojocneanu, 846 Del Rey Ave., Sunnyvale, CA (US) 94085; Lucian Scurtu, Str. Horia nr. 41, Codlea, Brasov (RO)

( * ) Notice: Subject to any disclaimer, the term of this patent is extended or adjusted under 35 U.S.C. 154(b) by 41 days.

(21) Appl. No.: 11/939,545

(22) Filed: Nov. 13, 2007

(65) Prior Publication Data
US 2008/0191725 A1   Aug. 14, 2008

Related U.S. Application Data

(63) Continuation-in-part of application No. 11/371,757, filed on Mar. 8, 2006, now Pat. No. 7,528,617.

(51) Int. Cl.
*G01R 31/02*   (2006.01)
(52) U.S. Cl. .................................... 324/754
(58) Field of Classification Search .................. None
See application file for complete search history.

(56) References Cited

U.S. PATENT DOCUMENTS 6,339,321 B1 *   1/2002   Yamashita et al. ......... 324/158.1
6,657,426 B1 *   12/2003  Powell et al. ............. 324/158.1
7,154,257 B2 *   12/2006  Le et al. .................. 324/158.1

* cited by examiner

*Primary Examiner*—Paresh Patel
(74) *Attorney, Agent, or Firm*—Ariel S. Bentolila; Bay Area IP Group, LLC

(57) ABSTRACT

An apparatus for testing semiconductor devices includes a first member configured as a drawer to be movable in and out of the housing and to receive a tray assembly containing semiconductor devices having exposed electrical contacts. The tray assembly includes a top portion and a bottom portion. The bottom portion includes structures for retaining the semiconductor devices in fixed positions and tray openings providing access to the electrical contacts. The top portion includes surfaces for contacting the semiconductor devices and a stress relief structure on the top. A second member moves the first member in a vertical direction to a tester pack. The tester pack sends and receives electrical signals to and from the semiconductor devices by way of the electrical contacts. A test computer provides instruction to the tester pack allowing the tester pack to test the semiconductor devices and return test information to the test computer.

23 Claims, 20 Drawing Sheets

APPARATUS AND METHOD FOR TESTING SEMICONDUCTOR DEVICES

CROSS-REFERENCE TO RELATED APPLICATIONS

The present continuation-in-part patent application claims priority benefit of the U.S. nonprovisional patent application Ser. No. 11/371,757 filed on Mar. 8, 2006 now U.S. Pat. No. 7,528,617 under 35 U.S.C. 120, which is hereby incorporated by reference for all purposes.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection. The copyright owner has no objection to the facsimile reproduction by anyone of the patent document or patent disclosure as it appears in the Patent and Trademark Office, patent file or records, but otherwise reserves all copyright rights whatsoever.

FIELD OF THE INVENTION

The disclosed embodiments relate generally to equipment for testing semiconductor devices, and more particularly, to an apparatus for testing semiconductor devices in a tray for holding the semiconductor devices.

BACKGROUND OF THE INVENTION

Testing is a major part of the production process for semiconductor devices, such as chips and memory modules, panels of memory modules, and PCBs. The testing stage of the semiconductor device production process identifies faulty devices and possibly entire faulty batches of devices before they reach the marketplace. The testing stage, however, can also become a bottleneck in the production process if performed inefficiently, especially for devices that require time-consuming testing such as Flash Memory Chips or modules containing Flash Memory Chips. Thus, it is important to have a high throughput at the testing stage.

Most semiconductor devices are placed in trays complying with well-known standards set by the standards body such as JEDEC, for subsequent testing, since most production automation equipment is designed to handle such trays automatically. A typical production tester uses a tray stack as input and 2 or more tray stacks as output for Pass, Fail1, Fail2, etc. The automated test system manipulates trays inside the machine as to allow pickup/placements of semiconductor devices from input trays, to be picked up for placement in test sockets, and then subsequently placed in output trays after performing the test. Such machines generally perform sorting, where the tested devices are placed in the top tray of one the Pass, Fail1, Fail2, etc tray stacks. Devices are generally moved from trays to test sockets 1, 2, 4 or 8 at a time. In addition, semiconductor devices are also moved between assembly stations, as well as shipped, in inexpensive plastic trays.

Testing time is of paramount importance and the main constituents include the indexing time, which is the time to move parts to and from the test socket, and the actual test time. The actual test time is independent of the automation. The throughput is a function of how many devices are tested in parallel by the system at any moment in time, and of the indexing time. These conventional automated test systems are generally very expensive. If the devices to be tested can be transferred a tray full at once, between a JEDEC, or a similar production tray, or a shipping tray, and a test tray, and then are left in the test tray to be tested, the cost of the system to the user is reduced considerably since the indexing time is reduced, and therefore the throughput of the system increases. Ultimately customers are paying for throughput.

In view of the foregoing, there is a need for a more efficient semiconductor device testing apparatus that increases the throughput of the testing stage.

BRIEF DESCRIPTION OF THE DRAWINGS

The present invention is illustrated by way of example, and not by way of limitation, in the figures of the accompanying drawings and in which like reference numerals refer to similar elements and in which.

Like reference numerals refer to corresponding parts throughout the drawings. It should be appreciated that the drawings are not necessarily drawn to scale and that the relative dimensions of various components in a given figure are also not necessarily drawn to scale.

SUMMARY OF THE INVENTION

Figure 1A:
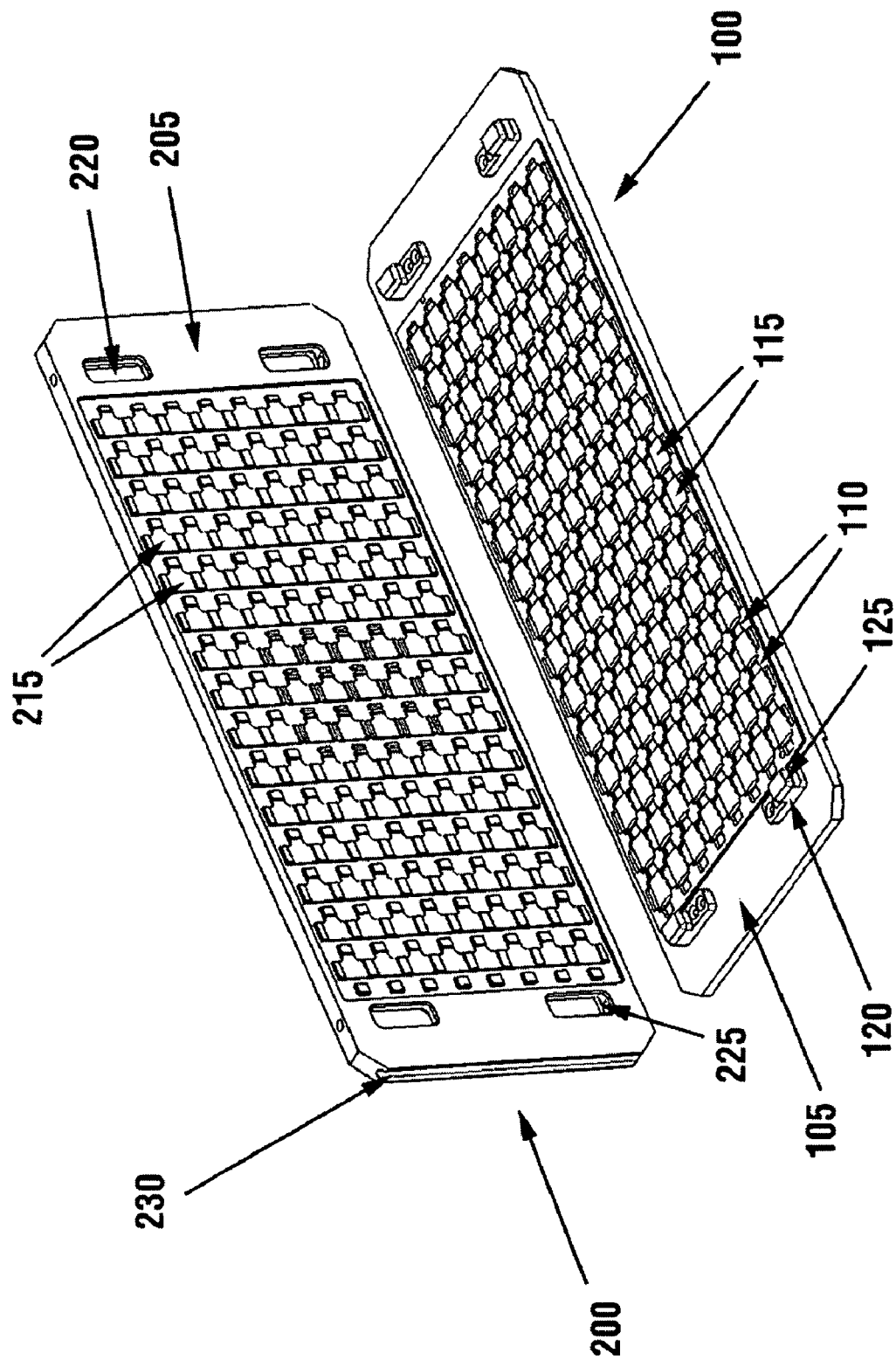
FIG. 1A illustrates an exemplary Tray for Test holding semiconductor devices and an exemplary Tray Cover, viewed from the bottom, in accordance with some embodiments.

To achieve the forgoing and other objects and in accordance with the purpose of the invention, an apparatus and method for testing semiconductor devices is presented.

In one embodiment, an apparatus for testing a plurality of semiconductor devices is presented. The apparatus includes a housing, a body contained within the housing including a first member configured as a drawer to be movable in and out of the housing in a generally horizontal direction. The first member includes a receptacle portion having at least one opening in the bottom thereof. The receptacle portion is configured to receive a tray assembly containing the plurality of semiconductor devices having exposed electrical contacts. The tray assembly including a top portion and a bottom portion, the bottom portion including a plurality of structures for retaining bottoms of the semiconductor devices in fixed positions, tray openings associated with each of the structures providing access to the electrical contacts and means for securing the top portion to the bottom portion. The top portion including a plurality of surfaces on a bottom of the top portion for contacting tops of the semiconductor devices. A second member substantially retains the first member when the first member is in the housing. The second member is configured to move the first member in a vertical direction within the housing. A tester pack is contained within the housing for receiving the tray assembly when the second member moves the first member proximate the tester pack, the tester pack configured to send and receive electrical signals to the semiconductor devices by way of the electrical contacts. A test computer is in communication with the tester pack where the test computer provides at least one instruction to the tester pack allowing the tester pack to test the semiconductor devices and return test information to the test computer. Another embodiment further includes a stress relief structure on a top of the top portion for dissipating stress relief transferred from the semiconductor devices and means for engaging the securing means. In another embodiment the apparatus further includes a test pin assembly including at least one test pin block including a plurality of test pins arranged in a plurality of clusters, the clusters arranged on the block to match the tray openings, a plate for retaining the test pin block, the plate configured for removably attaching to said tester pack and means for electrically connecting the test pins to the tester pack. In yet another embodiment the apparatus further includes alignment pins associated with the tester pack for engaging alignment holes associated with the test pin assembly where when the test pin assembly is attached to the tester pack, the connecting means is properly aligned. In still another embodiment the apparatus the tester pack sends and receives the electrical signals to the semiconductor devices by way of the test pins contacting the electrical contacts. In yet another embodiment, the tray assembly further includes tray alignment holes for engaging the alignment pins where when the tray assembly is proximate the tester pack, the test pins are in proper alignment with the electrical contacts. Another embodiment further includes a first motorized assembly for moving the first member in the generally horizontal direction and a second motorized assembly for moving the first member in the vertical direction. In still another embodiment the first motorized assembly includes a tongue, the first member further includes a bracket with a slot for engaging the tongue in a manner such that the first motorized assembly uses the tongue for moving the first member and when the second member moves the first member the tongue disengages from the bracket. In yet another embodiment the second member further includes means for providing a compression force on the top portion of the tray assembly when the test pins are in contact with the electrical contacts. In other embodiments, the second motorized assembly includes a single motor connected to a gear for rotating an axel to drive a belt which in turn rotates two lead screws to provide the vertical motion of the second member in a balanced manner and when the single motor is stopped, when the test pins are in contact with the electrical contacts, the compression force is maintained. In still other embodiments, the single motor is a stepping motor and adapted for servo control said test computer at least in part controls said first motorized assembly and said second motorized assembly. In yet another embodiment the tester pack is compactly contained within a footprint of the tray assembly whereby a signal length from the electrical contacts to a processor in the tester pack is optimized.

In another embodiment, an apparatus for testing a plurality of semiconductor devices is presented. The apparatus includes means for housing the apparatus, means for containing the plurality of semiconductor devices having exposed electrical contacts, means for receiving the containing means into the housing, means for testing the plurality of semiconductor devices in the containing means, means for moving the containing means to the testing means and means for instructing the testing means to test the semiconductor devices and return test information. Another embodiment further includes means for electrically connecting the testing means to the semiconductor devices. Yet another embodiment further includes means for aligning the containing means, connecting means and testing means. Other embodiments further include means for providing a compression force on the containing means when the testing means testing the semiconductor devices and means for maintaining the compression force during the testing. Still other embodiments further include means for optimizing a signal length from the containing means and the testing means and means for controlling the receiving means and the moving means.

In another embodiment a method of testing a plurality of semiconductor devices is presented. The method includes steps for placing a tray assembly containing a plurality of semiconductor devices into a receptacle configured to hold the tray assembly, steps for moving the receptacle into a housing of one or more test devices, steps for moving the receptacle to the one or more test devices, steps for contacting electrical contacts of each of the semiconductor devices with an electrical interface electrically connected to the one or more test devices, steps for applying force to the tray assembly, thereby securing the tray assembly to the electrical interface and steps for performing one or more tests on the semiconductor devices. Another embodiment further includes steps for retrieving information from the one or more tests.

Other features, advantages, and object of the present invention will become more apparent and be more readily understood from the following detailed description, which should be read in conjunction with the accompanying drawings.

DETAILED DESCRIPTION OF THE PREFERRED EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are numerous modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

The present invention will now be described in detail with reference to embodiments thereof as illustrated in the accompanying drawings.

In general, the following describes an apparatus and method for testing semiconductor devices. In some embodiments, the apparatus comprises an enclosure having at least one Tray Drawer for receiving a Tray for Test containing a plurality of semiconductor devices to be tested (DUTs). The DUTs are arranged in the Tray for Test such that electrical contacts of the DUTs are accessible through holes in the bottom of the Tray for Test. A Tray Cover is attached to the top of the Tray for Test where the inside of the Tray Cover contacts the devices. The Tray Drawer moves generally horizontally in and out of the enclosure such that when the Tray Drawer is in an out position, the Tray Kit, which is the Tray for Test and Tray Cover, can be loaded into the Tray Drawer. Once the Tray Kit is loaded, the Tray Drawer can be retracted into the enclosure to a home position. After the loaded Tray Drawer is in the home position, the Tray Drawer can then be lowered vertically to a to a test position, where the electrical contacts of the DUTs in the Tray for Test come in contact with an array of electrical connections such as, but not limited to, pogo pins connected to a compact tester mounted under the pogo pins bed-of-nails. Alternately, the contact with the DUTs can be achieved via spring wires or spring blades, or conductive polymers, connected to the tester. The vertical motion source is a single motor that drives 2 lead screws that implement a press mechanism via the single motor coupled to the system with a worm gear box. This allows for the elevation of the Tray for Test to be maintained during the duration of the test cycle without a brake system or some other blocking system, or without energy to be wasted to keep the torque on the motor active. The Tray for Test aligns with the pogo pins when two alignment pins, mounted, on the Tester Chassis, and protruding through the Tester Pogo Plat, engages alignment holes on the Tray for Test. Alternately, alignment can be done incrementally, using alignment pins to align only 2 adjacent surfaces.

Once the DUTs are in contact with the pogo pins, the compact tester can test the DUTs in parallel. In this manner a large number of devices can be tested simultaneously without having to place and then remove the devices from test sockets resulting in a substantial increase in throughput of the testing stage. The Tray Cover contains surfaces for each DUT against which the card is pressed by the pogo pins. Distorting the geometry of the Tray cover upwards, such as, but not limited to, bulging upwards in the middle, can create problems with the electrical contact of one or more pogo pins to the DUTs. In some embodiments of the preferred invention, the Tray Cover is designed with a stress relief structure such as, without limitation, a ribbed surface to allow for the stress relief exercised by the pogo pins to be dispersed without affecting the geometry of the cover. Other stress relief means will be readily apparent to those skilled in the art depending upon the needs of the particular application. Once the tester has finished testing the DUTs, the Tray Drawer can be raised back to the home position where Tray Drawer can be moved generally horizontally out for unloading the Tray Kit.

In preferred embodiments of the invention, precision machined, matching Tray for Test and Tray Cover are provided that match standard JEDEC trays, or production transit trays, or shipping trays, for easy transfer of DUTs. Matching Tray Cover is placed on top of such trays containing DUTs. The assembly is flipped and the original tray is removed leaving the DUTs on the Tray Cover. The Matching Tray for Test is then placed on top of Tray Cover and attached forming the Tray Kit ready to load into the Tray Drawer. Alternately, a flipping device can be designed which will perform the above operation in an automated manner. Alternately, A Test Tray can be placed manually above the Test Site, with the pogo pins touching the DUT connections. A manual or hydraulic or motor drive press can then be activated to press the DUTs against the Pogo pins.

Other embodiments of the present invention include a Sorting Fixture. A laser system controlled by the Test Computer is employed to do the laser light-pointing of failed devices. The Tray Kit containing tested DUTs is placed on the Laser Pointing Stand (LPS). The Tray Cover is removed a start button on the LPS is pressed. At that time a beam of red laser light emitted by the Laser Module mounted above and towards the back of the tray, starts to scan the Tray for Test and the DUTs placed it. The beam of laser light scans across the Tray for Test from side to side and from front to back with the frequency high enough for the human eye to perceive the light projected on the Tray for Test as a stationary image. The Laser Control Module (LCM) controls the laser light electronically. The LCM is connected to the Test Computer. The Test Computer contains the test result of which DUT inside the Tray for Test passed and which didn't. This information is fed to the LCM, which in turn controls the laser light ON/OFF switch in such a manner as to turn the laser light on at the moment the laser beam passes on top of the DUT that failed the test. The Laser Light being Red, the end result of this operation is for the DUTs that failed to be painted with a Red Light Dot (RLD). This Laser Light scanning of the Tray for Test on X and Y axis is analogous with the screen scanning implemented on CRT tubes. The end effect will be that an operator will see a tray in which the DUTs that failed are marked with red, while all of the other devices are left unmarked. The Laser Light is projected from above a backside of the tray, which allows the operator to pick up failed DUTs in an efficient and accurate manner. The Failed DUTs are picked up with a vacuum tweezers and placed in an empty tray for Failed devices. The emptied positions can be filled with DUTs from a buffer Passed Tray, so as to end up with full trays of Passed DUTs. An empty tray is placed on top of the Tray for Test and the assembly is flipped and placed back on the stand. A second empty tray is placed upside down on top of the first tray and the pair of trays is then reversed. The pair of trays is then placed on top of the stack of trays with Passed DUTs. The process is repeated for every new Tray for Test containing tested DUTs.

In a preferred embodiment of the present invention, a compact Tester Pack is included under the footprint of the Tray for Test. This configuration allow for general optimization of signal length from the DUT through test pogo pins, through the Test Kit circuit board, through Test Channel Interconnect Boards (CIB) to the test processor mounted on the Test channel boards. In most practical applications, optimization of the signal length is important to help mitigate signal problems, such as, but not limited to, noise and distorted signals, to provide a reliable system.

In other preferred embodiments of the present invention, a Pogo Kit is implemented. The Pogo Kit includes a pogo pin bed-of-nails fixture with Pogo Connectors for each DUT. The Tray Kit is configured for each technology tested. In the exemplary embodiment shown, the Tray Kit is configured for Micro Secure Digital (μSD) cards. For other devices, the number of pogo pins and locations for the pins may vary. The Pogo Kit contains alignment holes that align with pins on the bottom side with the Tester Pack, and on the upper side with the Tray for Test. The Pogo Kit mounts on top of the Tester Packs, which hold up to 4 test channels with up to 128 embedded test processors. In other embodiments, more or less test channels and embedded processors may be used. The Tester Pack aligns with the Pogo Kit via at least 2 alignment pins.

The features of the present preferred embodiment enable the devices to be tested without removing them individually forms the tray. Additional embodiments and corresponding features and functions are described further below in conjunction with the Figures.

Semiconductor Devices and Test Trays for Holding Same

The embodiments described herein are apparatuses for testing semiconductor devices. The semiconductor devices that may be tested by the disclosed embodiments include chips, memory cards, memory modules, and any other type of semiconductor device that may be carried and held in trays or similar containers. The semiconductor devices to be tested have electrical contacts that are exposed, for example, by extending outside of the housing of the device, or that are easily accessible within the device housing such that an electrical connection to the electrical contacts can be made. In typical use, the electrical contacts of these devices are to be electrically connected to other devices, such as, but not limited to, computers, in order to send data to or receive data from the respective semiconductor devices. In the embodiments described below, the exemplary semiconductor device to be carried in a Tray for Test and tested is a Micro Secure Digital memory card (μSD card). It should be appreciated, however, that while the description below may refer to μSD cards, the disclosed embodiments are not limited to testing only μSD cards. The disclosed embodiments may be adapted to test a wide variety of semiconductor devices including, but not limited to, Mini SD cards, SD cards, MultiMedia Cards (MMC cards), RS-MMC cards, T-Flash, C-Flash, Memory Stick (MS) cards, MS Duo cards, and USB Stick. It is also contemplated that the embodiments may also be adapted to a NAND Flash memory chips, NOR Flash memory chips, as well as NAND Flash memory die and NOR Flash memory die.

The above devices have one characteristic in common, long test times. However, due to the massively parallel nature of the test process, it is also contemplated that embodiments may also be adapted to a variety of other devices with short test times, such as, but not limited to Memory Card Controller, Generic microcontrollers, analog devices, mixed signal devices and passive components that have electrical contacts and can be placed in trays.

A Tray for Test is a tray having a plurality of cells or compartments arranged in a matrix array pattern and is designed for effortless transfer of DUTs from an original tray by essentially emulating the inside geometry of the original tray. An example of a Tray for Test is a Tray for Test that emulates well-known standards set by the standards body known as JEDEC, or by a commonly used memory card carrier tray used by the memory card manufacturers during production or for shipping. A cell may serve as a receptacle for a semiconductor device. In some embodiments, some cells in a Tray for Test may be configured to be locations for a tray transport device to attach to the tray, in addition to or instead of being configured as receptacles for semiconductor devices. For example, without limitation, those cells may be locations where a suction-based tray transport device may grab or attach to the tray. It should be appreciated, however, that any tray or container that holds at least one semiconductor device may be used and that the tray or container may have any structure, such as a bottom and walls or simply a skeletal frame that is configured to hold semiconductor devices.

A semiconductor device is held in a Tray for Test cell such that its electrical contacts are exposed, by way of example, not covered by the tray structure itself or held such that the electrical contacts are accessible to allow for an external electrical connection to be made to the contacts. In some embodiments, within a cell, there may be one or more apertures or openings in the bottom of the tray that expose the electrical contacts of a semiconductor device in the cell. For example, each tray may have an opening corresponding to each one of the cells in the tray. In this case, the semiconductor device is oriented within the cell such that the electrical contacts of the semiconductor device face the aperture, protrude through the aperture, or are otherwise adjacent to the aperture. This orientation allows for access to, or an electrical connection to be made to, the electrical contacts of each of the semiconductor devices in the tray without having to remove the devices from the tray. In some other embodiments, a single aperture or opening may traverse a plurality of cells, exposing electrical contacts of a plurality of semiconductor devices that are held in those cells. The number of cells in a tray, the arrangement of the cells, and the configuration of the apertures in the cells may vary based in part on the type of semiconductor device to be carried by the tray.

FIG. 1A illustrates an exemplary Tray for Test holding semiconductor devices and an exemplary Tray Cover, viewed from the bottom, in accordance with some embodiments. The exemplary Tray for Test 100 as shown in FIG. 1A is configured to hold μSD cards 115. The Tray for Test 100 includes a plurality of cells 110 arranged in a matrix array pattern. In Tray for Test 100, cells 110 are configured to hold μSD cards 115 or are configured as a location where a suction-based tray transport device may attach to the tray to transport it. In some embodiments, a Tray for Test may have cells that are configured only as locations where a tray transport device may attach to the tray. A tray transport device may also attach to the Tray for Test 100 on the side of the tray 105. Each cell 110 may include one or more apertures 130, FIG. 1B, for exposing electrical contacts of a μSD card 115 resting in the cell 110 with the electrical contacts facing the aperture. In some embodiments, the cell structure is customized or has conforming walls that engage the sides of the μSD card or allow the μSD card to be snapped into place.

In a preferred embodiment, four attachment devices 120 for attaching a top cover 200 are provided on surface 105. The attachment devices 120 are of a snap type device, although other well-known attachment means may be utilized. The attachment devices 120 have notch 125 for engaging snap-in spring balls 225 of top cover 200.

Figure 1B:
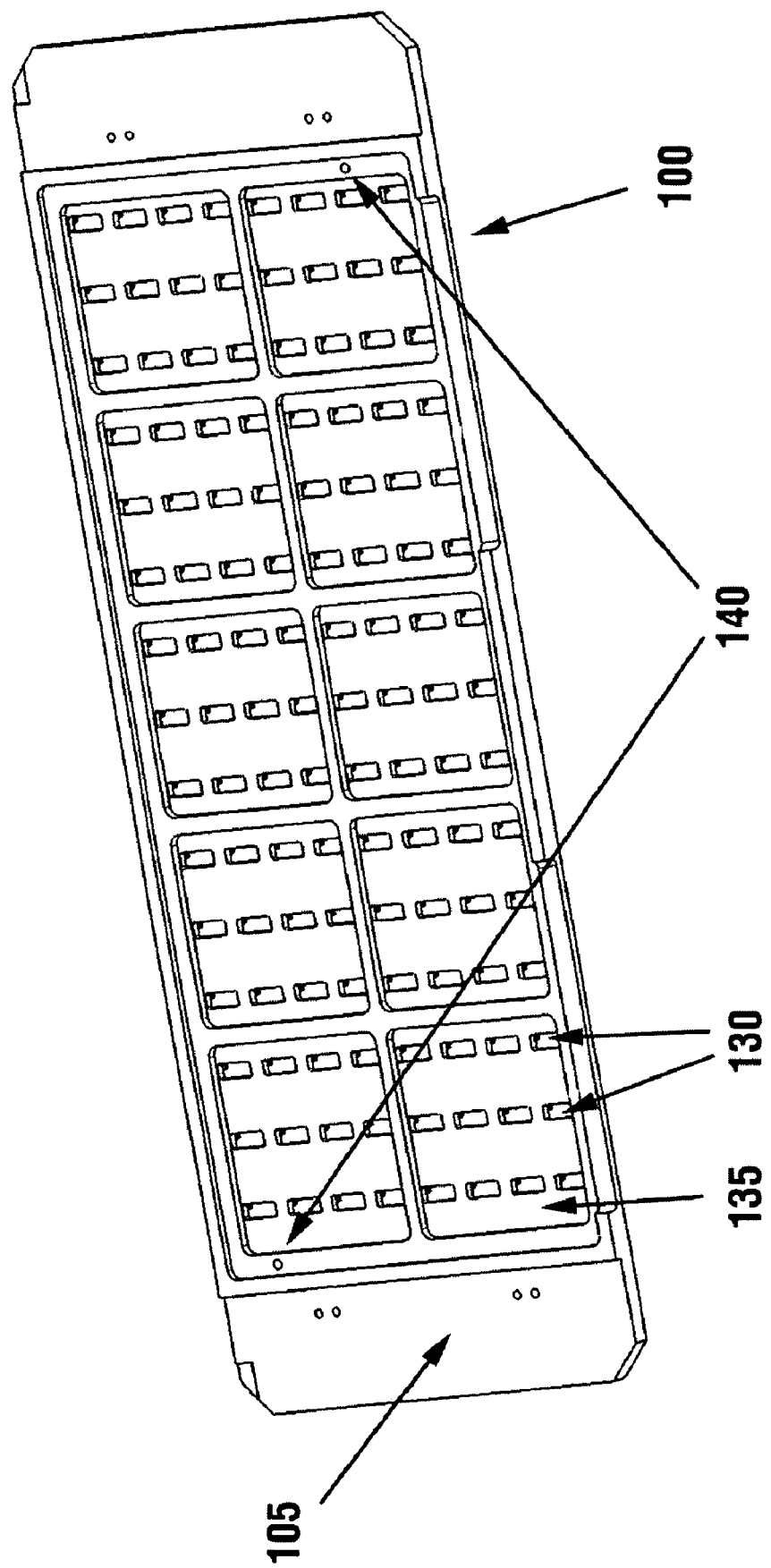
FIG 1B illustrates a bottom view of the Tray for Test of FIG. 1A.

FIG. 1B illustrates a bottom view of the Tray for Test of FIG. 1A. Apertures 130 provide access to electrical contacts of μSD cards 115. In the preferred embodiment, tray alignment holes 140 are provided to properly align the Tray for Test during the testing stage. In some embodiments, indents 135 mate with blocks containing the pogo pins. The size and shape of indents 135 will vary depending on the size and number of devices in the Tray for Test and the arrangement of the pogo pins. In some embodiments, indents 135 may be omitted.

Tray cover 200 comprises a plurality of stress relief surfaces 215 that are dimensioned to contact the top surface of the μSD cards 115. In other embodiments for testing different technologies, these surfaces may have different sizes and or shapes. When the Tray Cover 200 is in place over Tray for Test 100, pressure from the pogo pins presses μSD cards 115 against surfaces 215. In the preferred embodiment, openings 220 in surface 205, containing snap-in spring balls 225, mate with attachment devices 120 to secure top cover 200 to Tray for Test 100. In some embodiments, slot 230 is provided to facilitate removal of the top cover from the Tray for Test.

Figure 2:
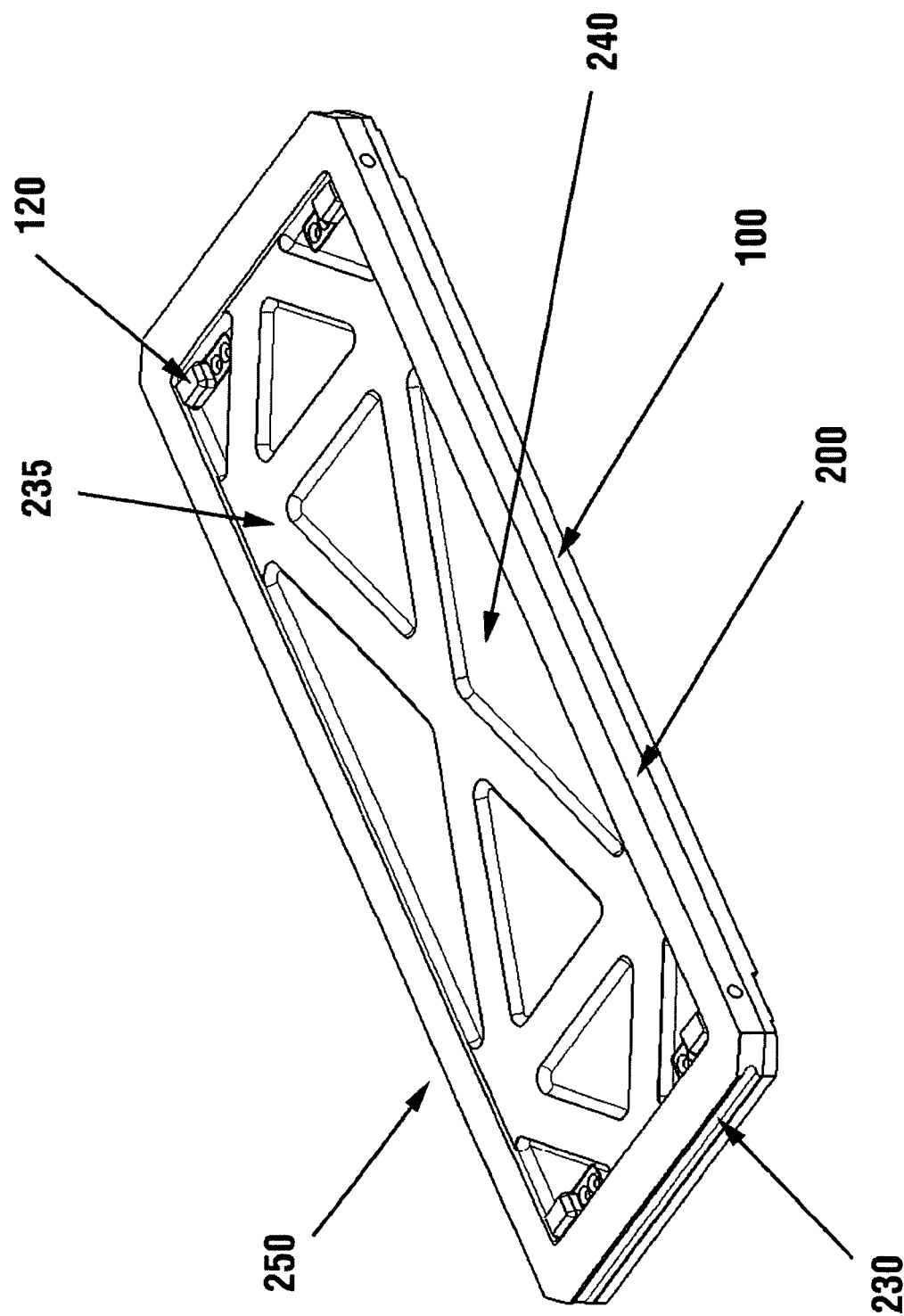
FIG. 2 illustrates a top view of an exemplary Tray Kit where the Tray Cover is attached to the Tray for Test of FIG. 1A in accordance with an embodiment.

FIG. 2 illustrates a top view of an exemplary Tray Kit where the Tray Cover in FIG. 2A is attached to the Tray for Test of FIG. 1A in accordance with an embodiment. Tray kit 250 comprises Tray Cover 200 attached to Tray for Test 100. Attachment devices 120 are shown extending through openings 220. In the preferred embodiment, ribs 235 extend across the top surface 240 of top cover 200. The ribs 235 allow for the stress relief exercised by the pogo pins to be dispersed without affecting the geometry of the cover. Distorting the geometry of the Tray Cover upward, such as, but not limited to, bulging upwards in the middle, can create problems with the electrical contact of one or more pogo pins to the DUTs. Ribs 235 are designed to mitigate this problem in many practical applications. The shape and pattern of the ribs are chosen considering factor such as, but not limited to, size of the top cover and the pressure exerted by the pogo pins. In the embodiment shown, the force the pogo pins, is approximately 50 kg.

Semiconductor Device Testing Apparatus

Figure 3A:
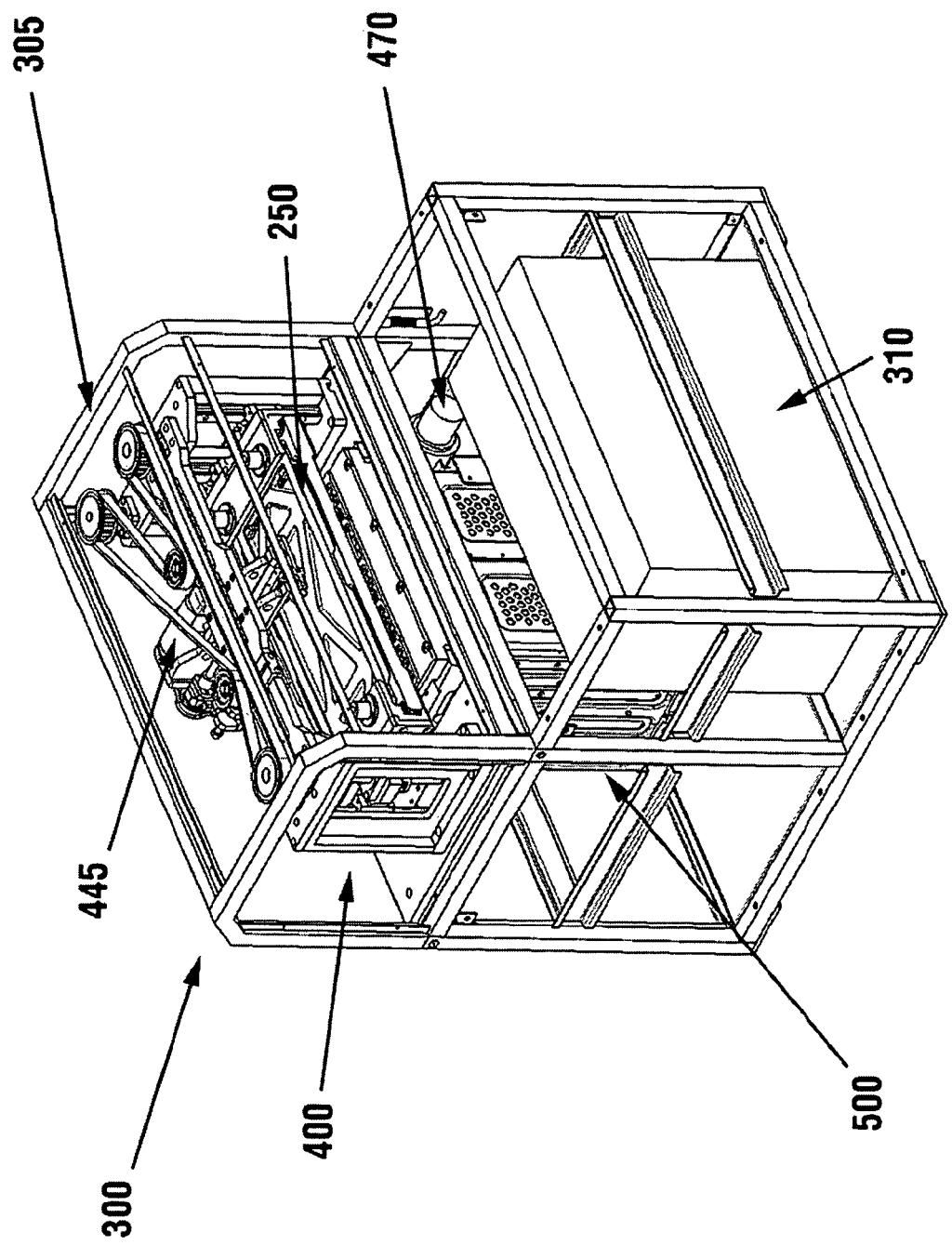
FIGS. 3A and 3B illustrate a perspective views of an exemplary apparatus for testing semiconductor devices, in accordance with some embodiments.
Figure 3B:
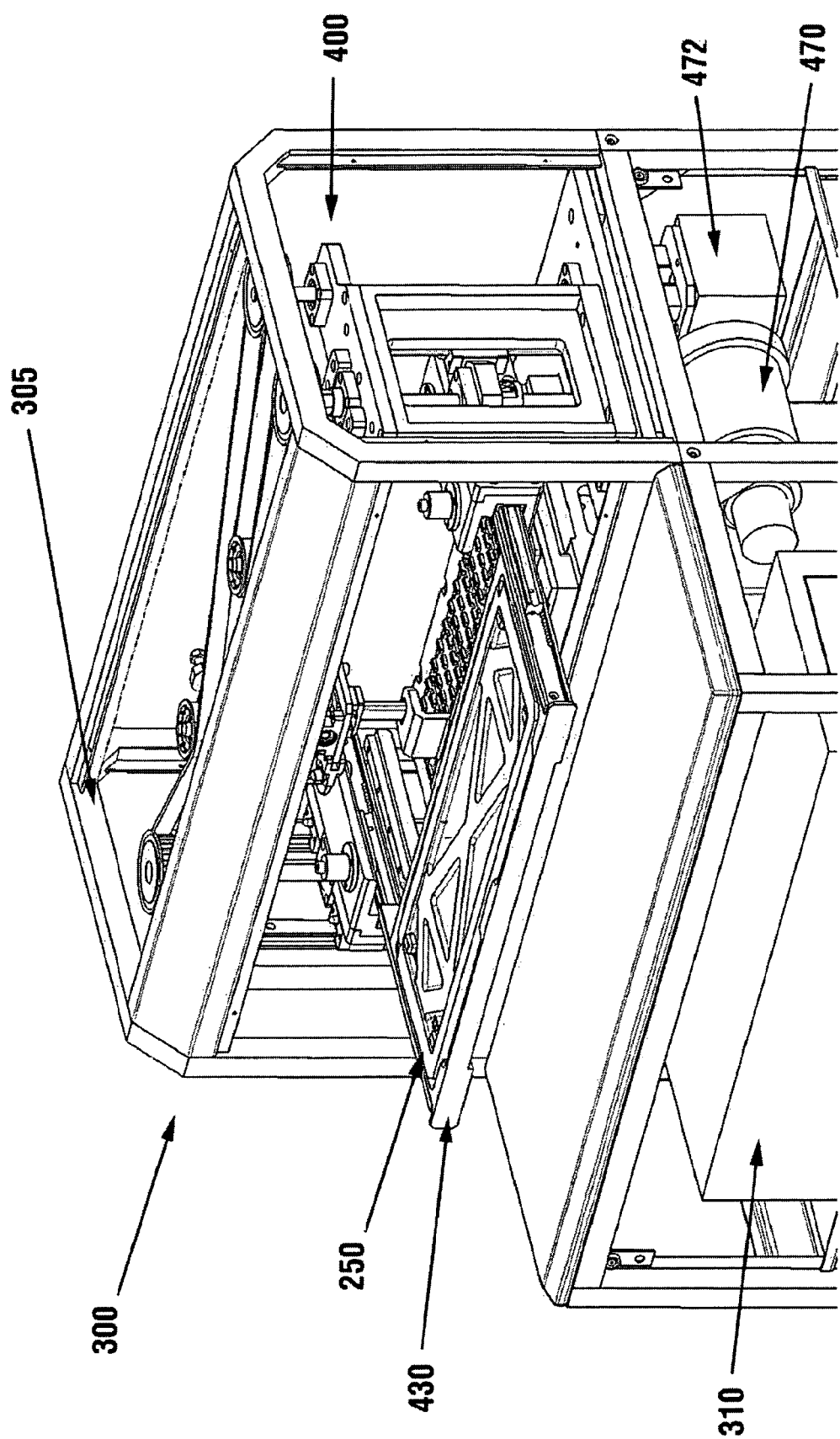

FIG. 3 illustrates a perspective view of an exemplary apparatus for testing semiconductor devices, in accordance with some embodiments. The semiconductor device testing apparatus 300 includes a body 400 surrounded and supported by a housing or chassis 305. In some embodiments, the housing 305 may also include exterior panels (not shown for clarity) including, but not limited to, one or more air vents and access doors. Furthermore, in some embodiments, the panel and doors may be translucent or transparent so that users of the apparatus 300 can see from the exterior of the apparatus into the interior. In some embodiments, fans or other air intake/outtake systems (not shown) may draw air into or out of the apparatus 300.

Within the apparatus 300 are at least three compartments or sections in which the body 400, Tester Pack 500 and test computer 310 reside. Vertical motor 470 and horizontal motor 445 provide motive power for generally vertical and horizontal motion of components of body 400. Tray Kit 250 is shown in a lowered test position.

Figure 4:
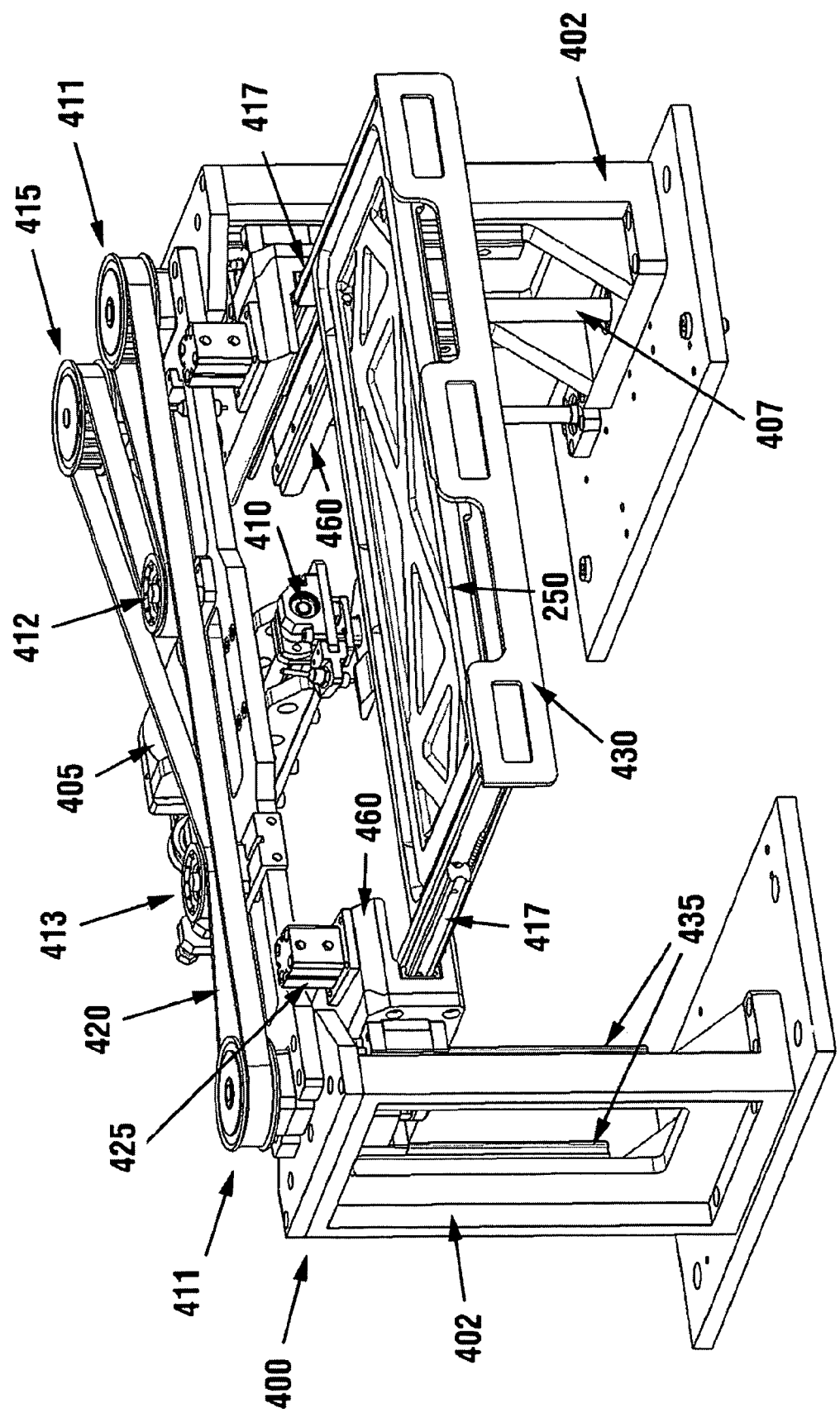
FIG. 4 illustrates a perspective view of the body in FIG. 3.

FIG. 4 illustrates a perspective view of the body in FIG. 3. Test tray Kit 250 is shown loaded into Tray Drawer 430 with Tray Drawer 430 in an open position. The Tray Drawer is mounted on horizontal slides 417 for movement in and out of body 400. In the preferred embodiment, horizontal slides 417 are ball bearing type slides for smooth movement; however, other suitable means to achieve smooth movement may be implemented. Tray drawer 430 is moved by a tongue 450 and bracket 455 (shown in FIG. 5) on lead screw 410 driven by horizontal motor 445. When Tray Drawer 430 is fully retracted into the body, Tray Drawer 430 is substantially contained within horizontal slide brackets 460. Tray kit 250 is shown loaded in Tray Drawer 430. Horizontal slide brackets 460 are attached to vertical slides 435 on support members 402 for movement vertically within the body. Each horizontal slide bracket is moved by rotation of a lead screw 407. The vertical motion source is vertical motor 470 attached to a worm gearbox 472 to rotate vertical axel 465 (shown in FIG. 6). Vertical axel 465 turns drive wheel 415 moving drive belt 420. Drive belt 420 engages adjustable stretcher wheel 413, wheel 412 and lead screw wheels 411 to allow for the belt to achieve over 180 deg wrap around the driving wheel 415 and the lead screw wheels 411. This provides for vertical movement in a balanced manner from a single motion source. In the preferred embodiment, the vertical motor 470 is a stepping type motor adapted for servo control. In some embodiments, the test computer controls the vertical motor. In another alternative embodiment the vertical motion may be implemented in different ways, including using 2 sources of motion for each vertical slide, 2 motors on each vertical slide, and synchronizing them.

Figure 5:
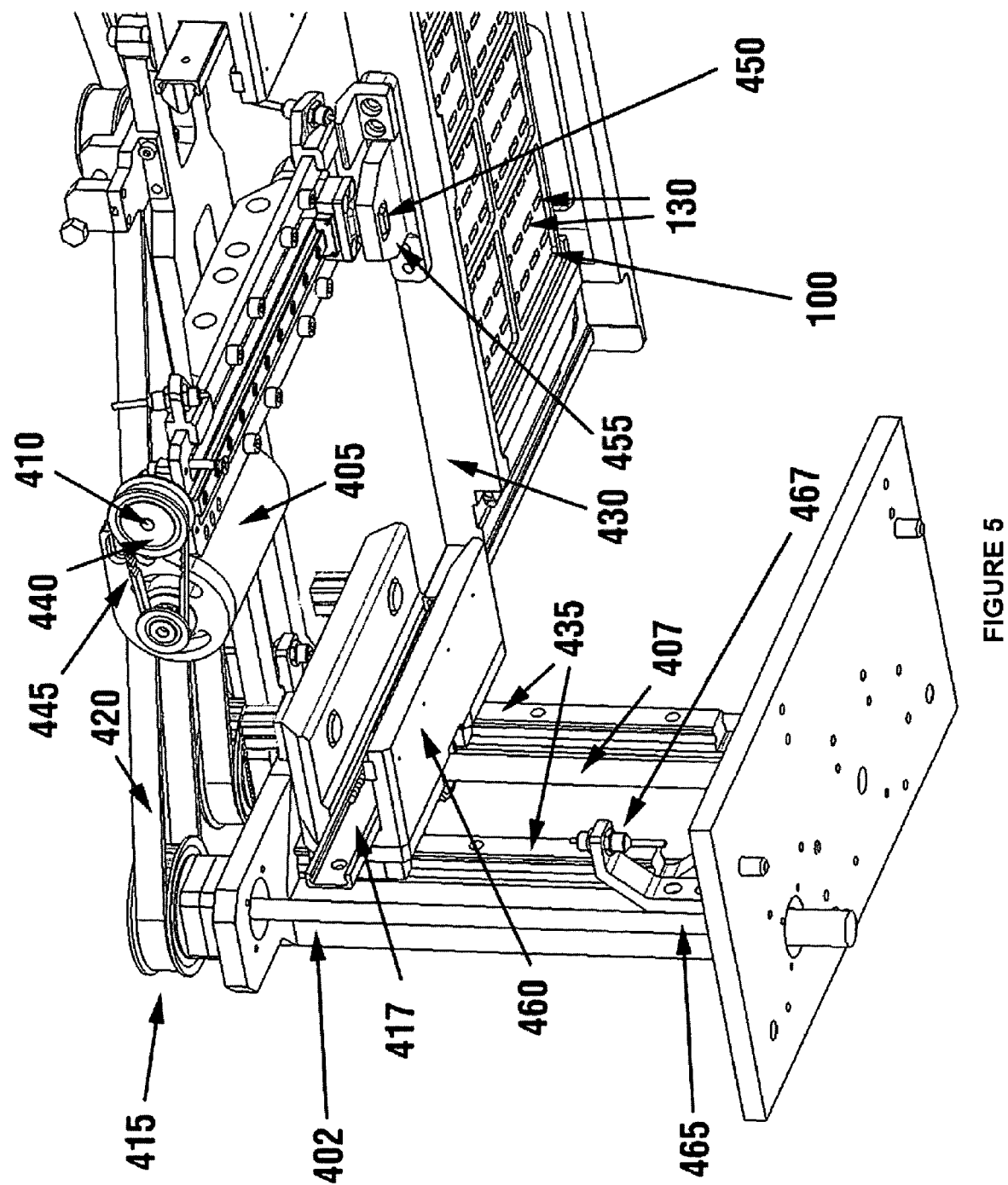
FIG. 5 illustrates a perspective view from below showing a portion of the body in FIG. 3.

FIG. 5 illustrates a perspective view from below showing a portion of the body in FIG. 3. Horizontal motor 405 drives belt 445 turning wheel 440 in turn driving lead screw 410. As lead screw 410 turns, an assembly containing tongue 450 is moved horizontally along lead screw 410. Tongue 450 engages a slot in bracket 455 attached to the back of Tray Drawer 430. This allows the Tray Drawer to in and out of body 400 along horizontal slides 417. When Tray Drawer 430 is fully retracted into horizontal slide brackets 460, Tray Drawer 430 can be moved vertically downward with tongue 450 disengaging from bracket 455. Limit switch 467 senses when the horizontal slide brackets have reached their full downward movement. Other embodiments may not have a limit switch or may use other position sensing means, such as, but not limited to optical sensing. In another alternative embodiment the horizontal motion may be implemented using a teeth belt and slide driven by a stepper motor.

Figure 6:
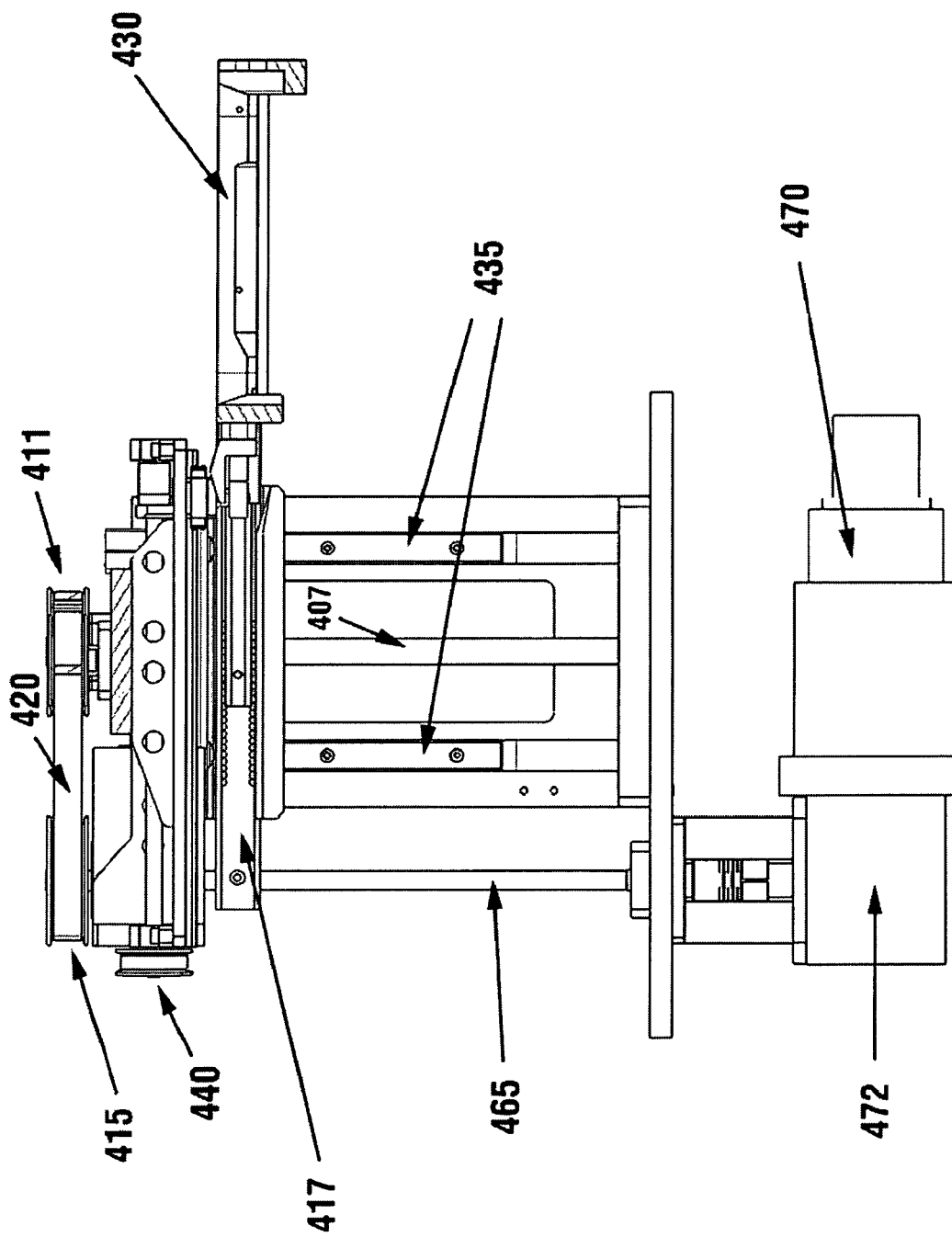
FIG. 6 illustrates a cross sectional view of the body in FIG. 3.

FIG. 6 illustrates a cross sectional view of the body in FIG. 3. In this view, Tray Drawer 430 is in the fully open position.

Figure 7:
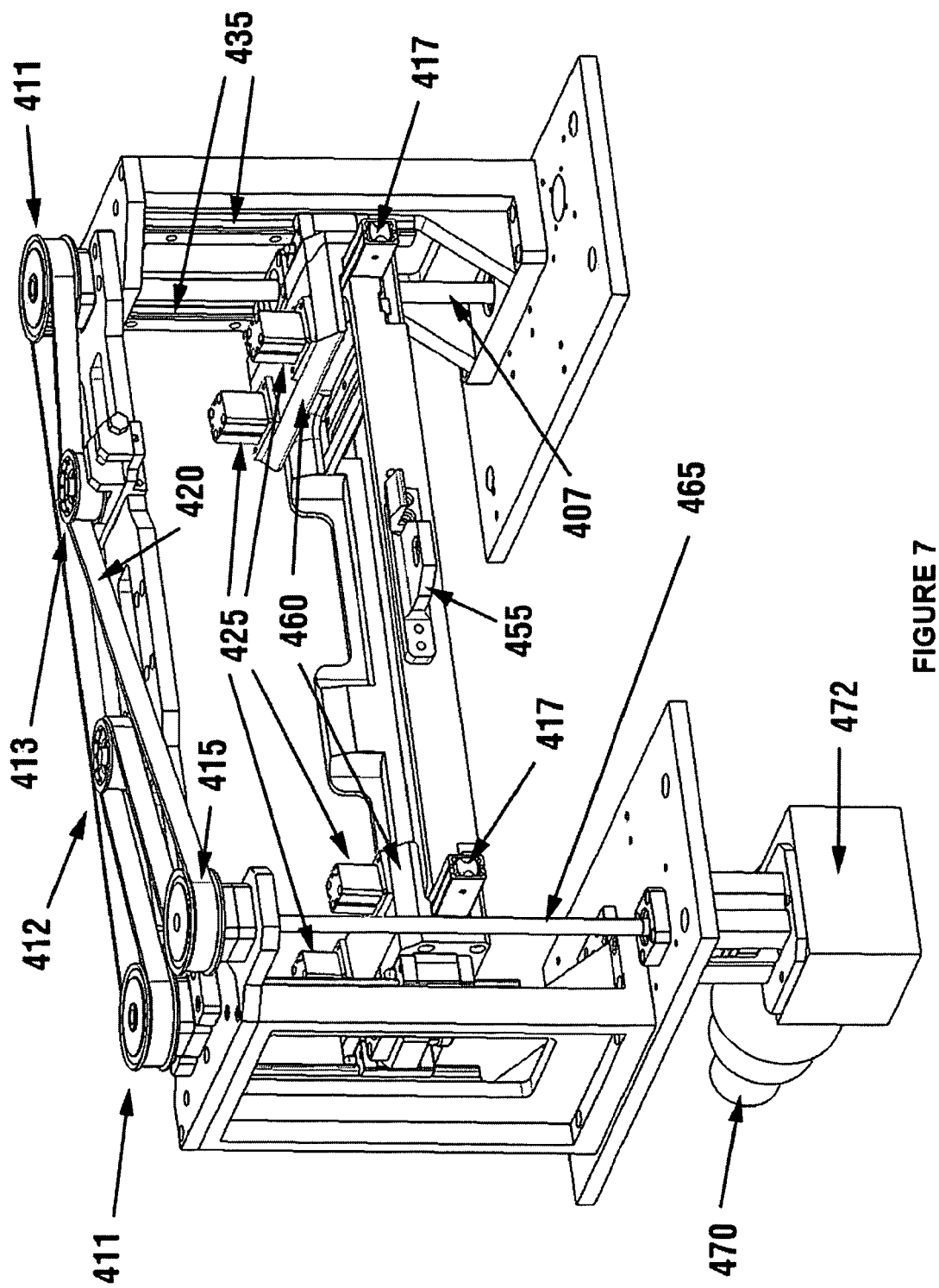
FIG. 7 illustrates a perspective view of the body in FIG. 3 showing the exemplary vertical drive mechanisms.

FIG. 7 illustrates a perspective view of the body in FIG. 3 showing the vertical drive mechanisms.

Figure 8:
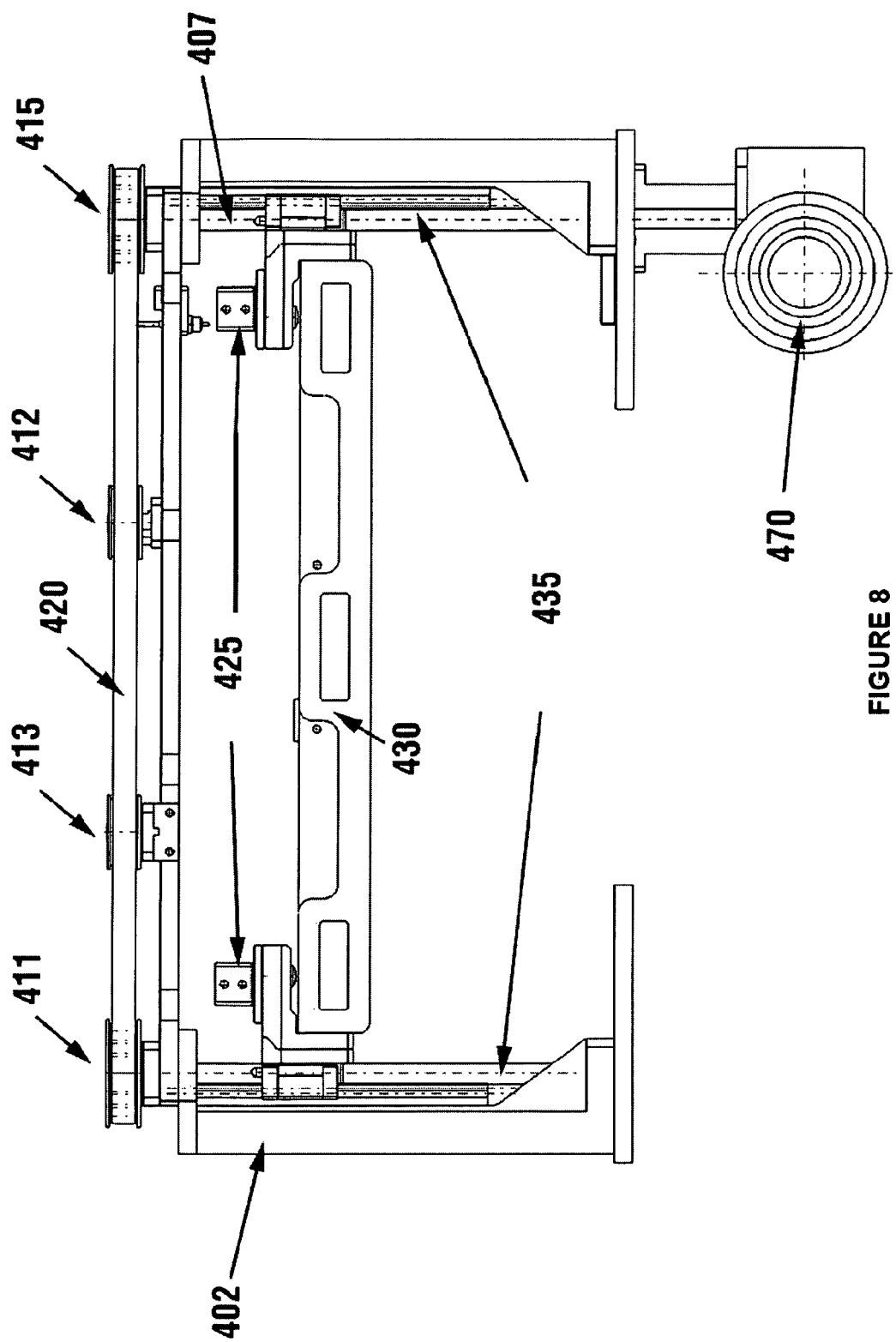
FIG. 8 illustrates a front view of the body in FIG. 3 showing the exemplary vertical drive mechanisms.

FIG. 8 illustrates a front view of the body in FIG. 3 showing the vertical drive mechanisms.

Figure 9:
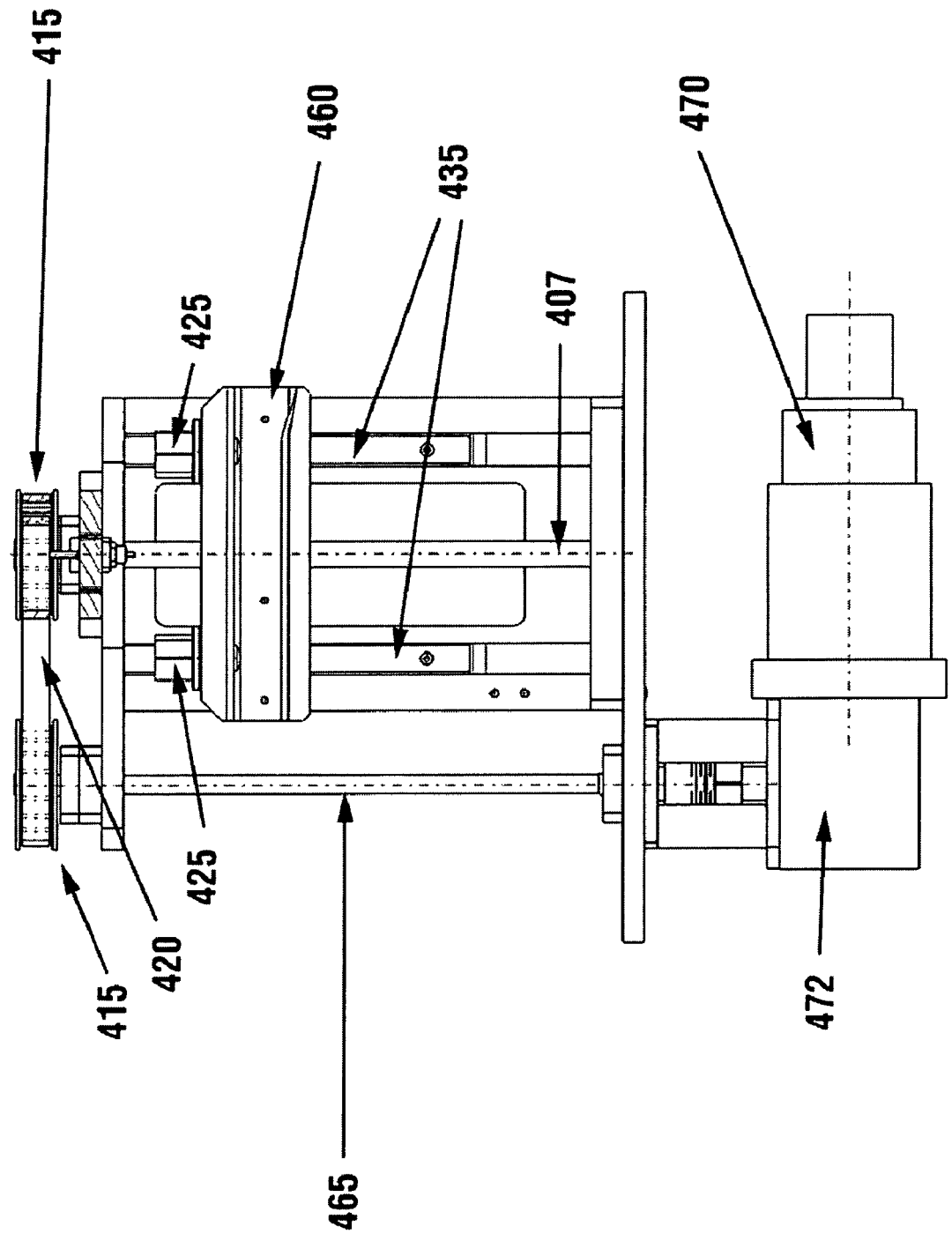
FIG. 9 illustrates a side view of the body in FIG. 3 showing the exemplary vertical drive mechanisms.

FIG. 9 illustrates a side view of the body in FIG. 3 showing the vertical drive mechanisms.

Figure 10:
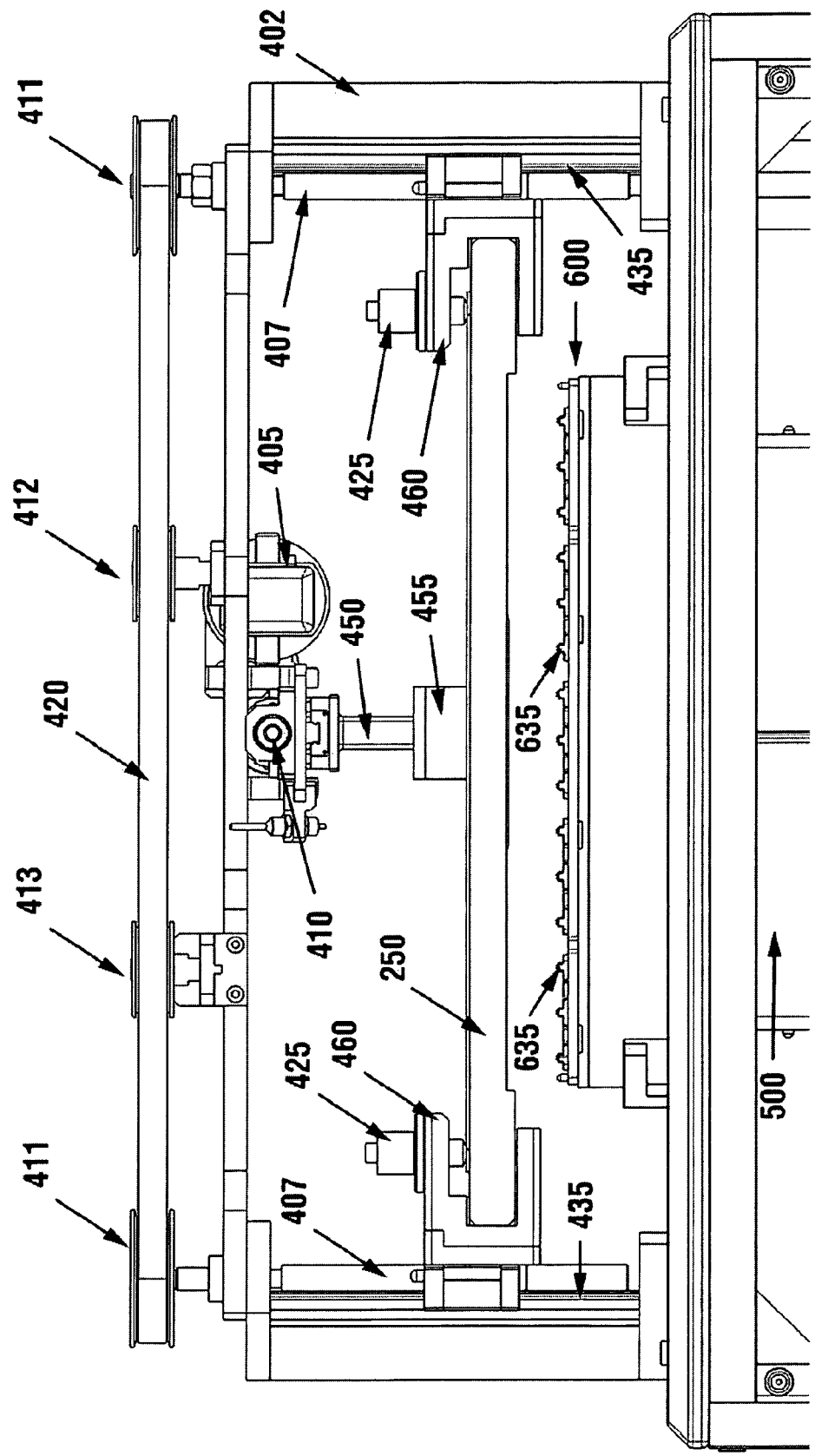
FIG. 10 illustrates a front view of the Tray for Test in a home position before being lowered.
Figure 11:
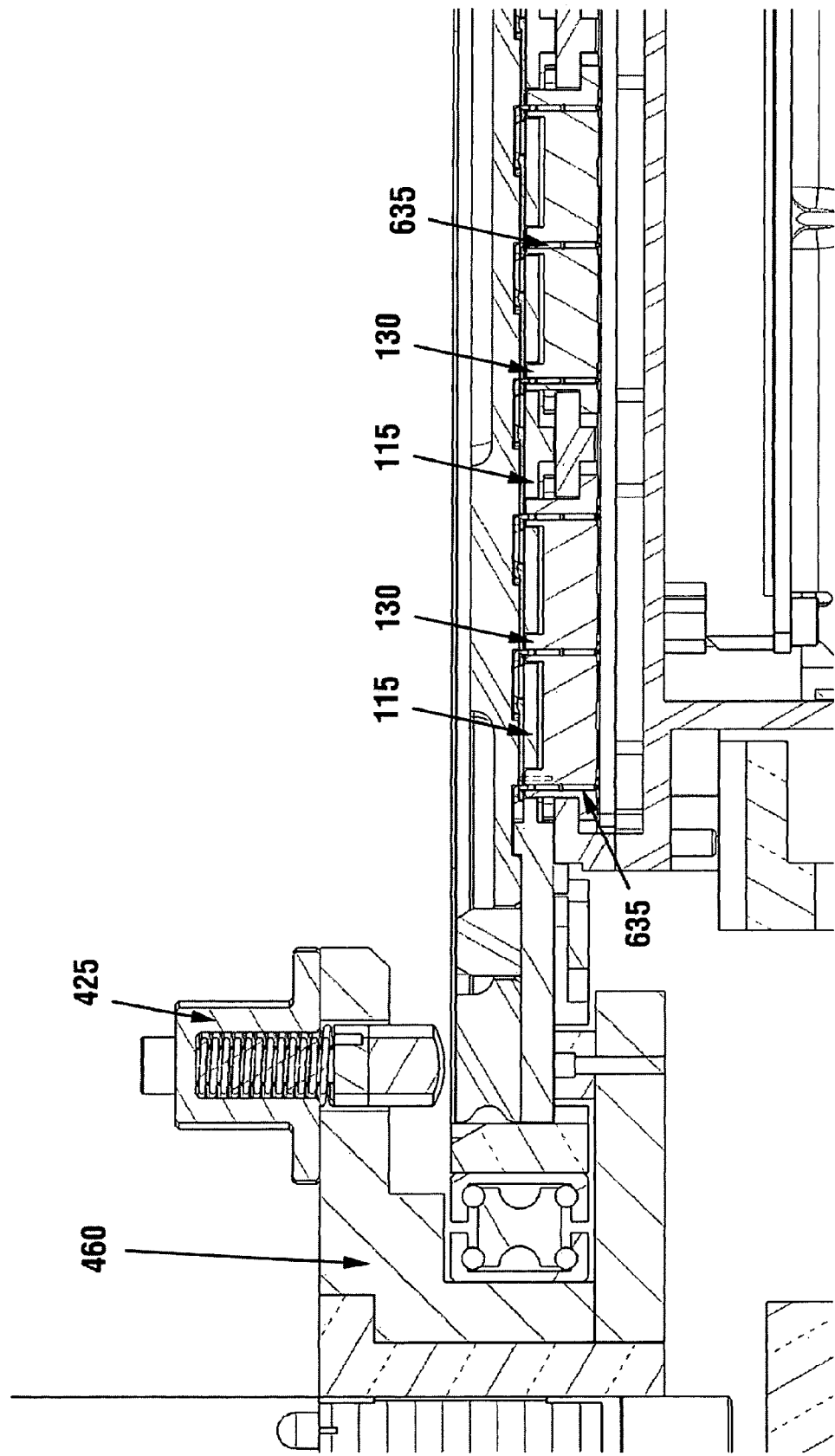
FIG. 11 illustrates a cross-sectional front view of pogo pins contacting DUT electrical contacts.
Figure 12:
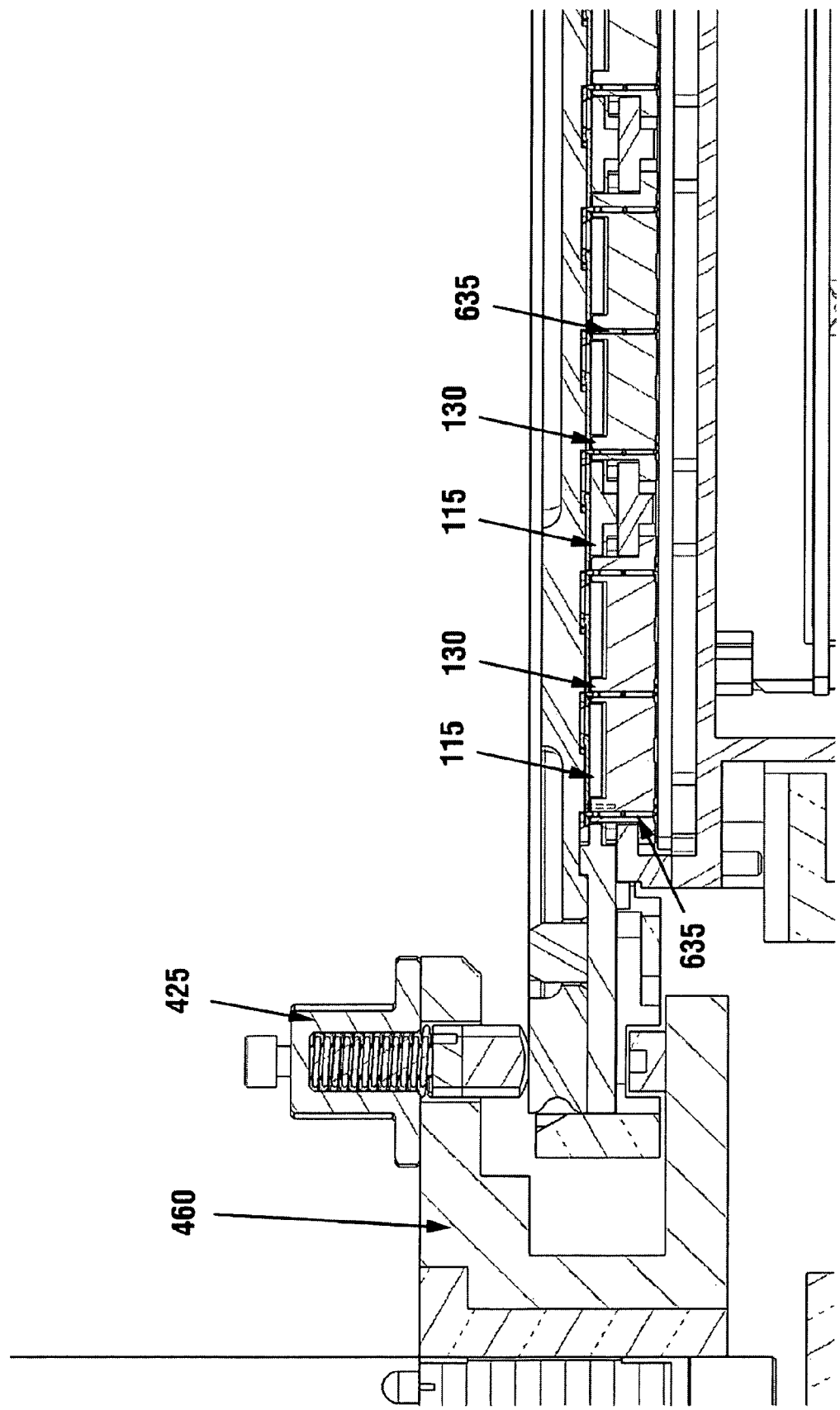
FIG. 12 illustrates a cross-sectional view of spring cylinders being compressed.
Figure 13:
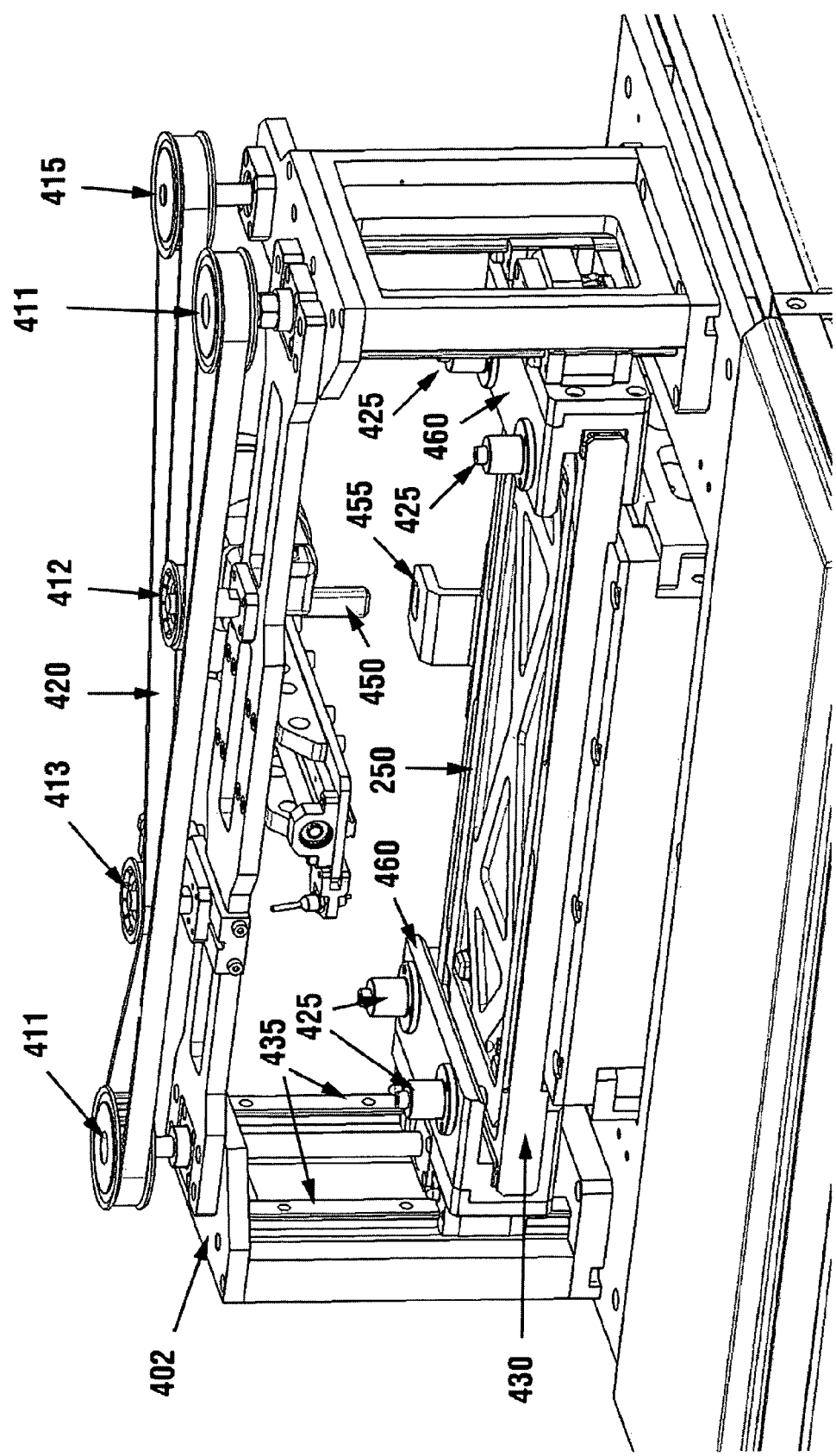
FIG. 13 illustrates a perspective view of the body in FIG. 3 in the test position.

FIG. 10 illustrates a front view of the Tray for Test in a home position before being lowered. FIG. 11 illustrates a cross-sectional front view of pogo pins contacting DUT electrical contacts. FIG. 12 illustrates a cross-sectional view of spring cylinders being compressed. FIG. 13 illustrates a perspective view of the body in FIG. 3 in the test position. As the Tray Drawer 430 moves downwards from the home elevation toward the test elevation, at a certain elevation the tips of chamfered alignment pins 520 and 620 mounted on Pogo Kit 600 (shown in FIG. 12) will engage corresponding chamfered alignment holes 140 in the Tray Kit 250. As the Tray Drawer 430 continues downwards, the Tray Kit 250 inside the Tray Drawer will fully align with the Pogo Kit 600, the Tray Kit 250 sitting freely inside the Tray Drawer 430. At a certain elevation, the tips of the pogo pins touch the contact pads of the μSD cards 115 inside the Tray Kit 250 via openings 130 in the Tray for Test 100. From that elevation, due to the pressure placed on the μSD cards 115 inside the Tray Kit, the Tray Kit will remain suspended on the tips of the pogo pins as the Tray Drawer 430 continues to move downwards. At a given elevation, 4 spring cylinders 425, mounted on left and right horizontal slide brackets 460, which in turn are mounted on the vertical slides 435, will engage the Tray Kit 250 and start to press it downwards until the test elevation, when the bottom side 105 of the circumference of the Tray Kit 250 will come in contact with the perimeter of the Pogo Kit 600. The test cover 200 is designed with a ribbed surface 235 to allow for the stress relief exercised by the pogo pins to be dispersed without affecting the geometry of the cover. The test cover 200 contains surfaces 215 for each μSD card 115 against which the card is pressed by the pogo pins. Distorting the geometry of the Tray cover upwards, bulging upwards in the middle, would create contact problems with the pogo pins. The Tray Drawer 430 can continue to move downwards for another distance until it reaches the bottom. The compressing of the spring cylinders 425 absorbs this movement. This will allow for an accurate positioning of the Tray Kit 250 above the Pogo Kit 600, eliminating the need for a very precise vertical positioning of the Tray Kit 250 by the vertical motion mechanism at the precise test elevation. At the test elevation, the system is designed such as to achieve the compression of the pogo pins to the normal operating position, about the middle of the compression range. The configuration of the vertical motor 470, worm gearbox 472, vertical axel 465, drive belt 420 engaging with stretcher wheel 413, wheel 412 and lead screw wheel 411, allows the vertical motor 470 to be stopped when the Tray Kit is at the test elevation without having to provide a brake to maintain the compression of the pogo pins. In the exemplary preferred embodiment the total force for the pogo pins is about 50 kg. In another alternative embodiment, Air Cylinders, which would use compressed air, may replace the Spring Cylinders 425, since most manufacturing facilities have source of compressed air. This will then be suitable more for manufacturing environments, rather than office environments since in office environments there is typically no source of compressed air, and an air compressor is typically noisy.

Figure 14:
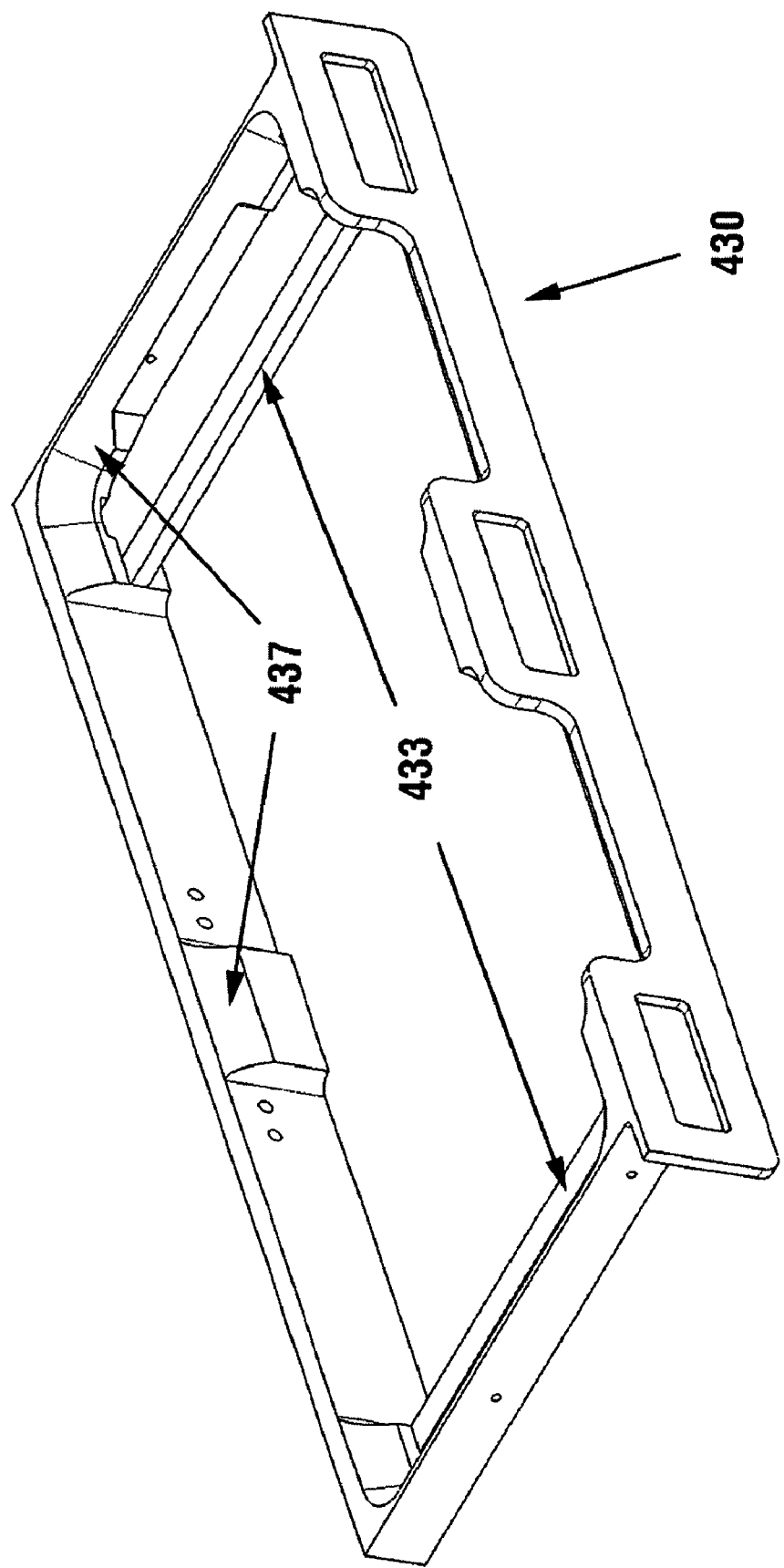
FIG. 14 illustrates a perspective view of the exemplary Tray Drawer.

FIG. 14 illustrates a perspective view of the Tray Drawer. Tray drawer 430 comprises support pieces 433 upon which the Tray Kit 250 rests. Chamfered sides 432 provide easy loading of the Tray Kit 250. When the Tray Kit is loaded, chamfered sides 432 guide the Tray Kit to the proper position in the Tray Drawer.

Figure 15:
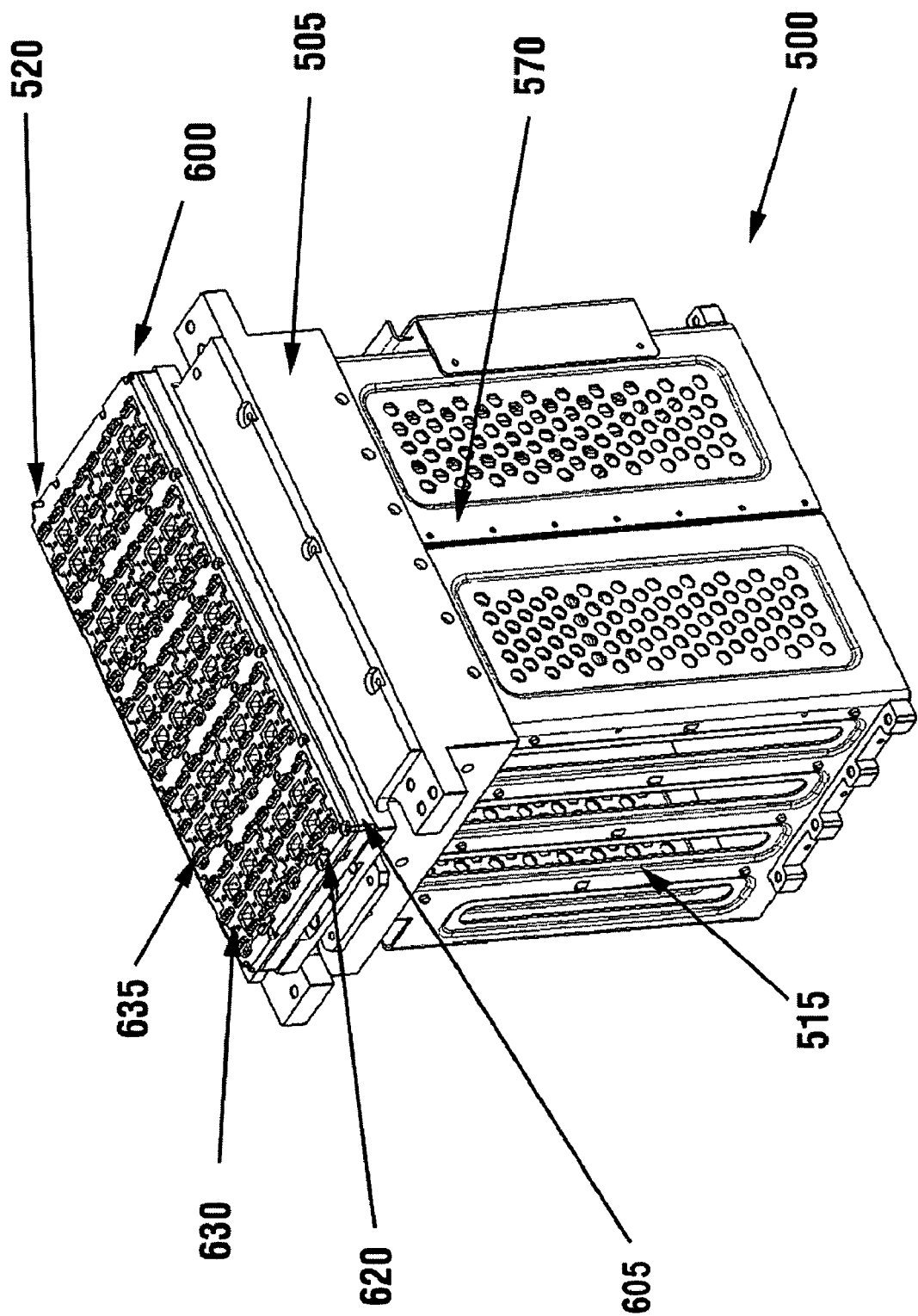
FIG. 15 is a perspective view of an exemplary Tester Pack and Pogo Kit assembly of an embodiment of the invention.

FIG. 15 is a perspective view of an exemplary Tester Pack and Pogo Kit assembly of an embodiment of the invention. The assembly 500 comprises a main chassis 505 to which a Tester Pack 510 is attached below. In the preferred embodiment, Tester Pack 510 comprises up to four test channels 515. Other embodiments may comprise more or less test channels. Each test channel is configured to test up to thirty-two DUTs. Other embodiments may be configured to test more or less devices. The test channels are circuit boards having a processor and memory and are configured to run tests on various types of semiconductor devices. The tests that are run may vary based on the type of semiconductor device to be evaluated or tested and based on the particular type of test to be conducted. In a preferred embodiment, the test channels are connected to the test computer 310. In some embodiments, the test channels may be further connected to a computer server (not shown). The test computer 310 may be configured to, among other things, but not limited to, control the testing process, collect data from the tests, and display the data from the tests. On a top of main chassis 505 is attached a Pogo Kit 600. In the exemplary preferred embodiment, Pogo Kit 600 is configured for μSD cards 115. In other embodiments, the Pogo Kit is configured to match the electrical connections of the devices to be tested and the arrangement of the devices in the Tray for Test. Alignment pins 520 and 620 align the Pogo Kit 600 to the Tester Pack 570 and further align the Tray Kit 250 to the Pogo Kit 600 via alignment holes 140. The Tester Pack 510 is designed for fast speed testing, required by the latest device technologies, including Flash Cards. The tester and pogo kit fit effectively underneath the Test Tray. This minimizes the signal distances between the DUT contacts and the Test Processors embedded inside the Test Channels, thus allowing for testing of devices at high test speeds/clocks. In a preferred embodiment, the Pogo Connector Blocks uses pogo connectors that serve an array of 4×3=12 DUTs. Another alternative embodiment may implement other combinations, including 1 Pogo Connector Block per DUT. Furthermore in other embodiments the Pogo connector is done using 1 part. In another embodiment the Pogo connectors may be implemented out of 2 parts, especially if the pogo pin has a flange which would be sandwiched between the parts.

Figure 18:
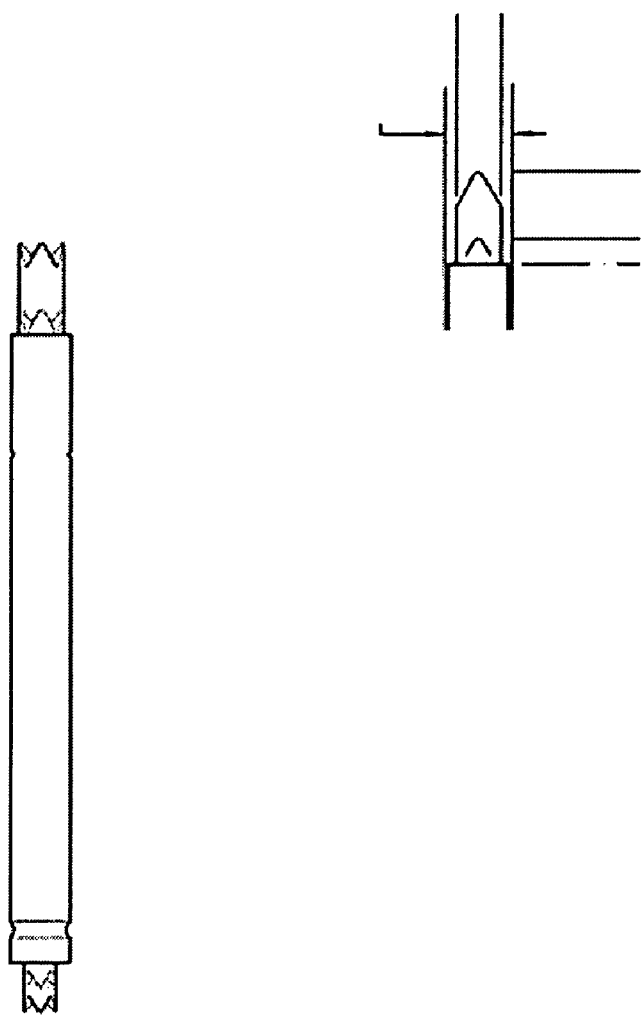
FIG. 18 shows different types of test pin heads to be used for different type of DUT's, in accordance with an embodiment of the invention.

Pogo pins are specific to the type of DUT. Aside from the total length and diameter of the barrel, the type of test pin head is most critical. FIG. 18 shows different types of test pin heads to be used for different type of DUTs (cone for Memory Cards, Crown for BGA, Pin for TSOP, etc.

Figure 16:
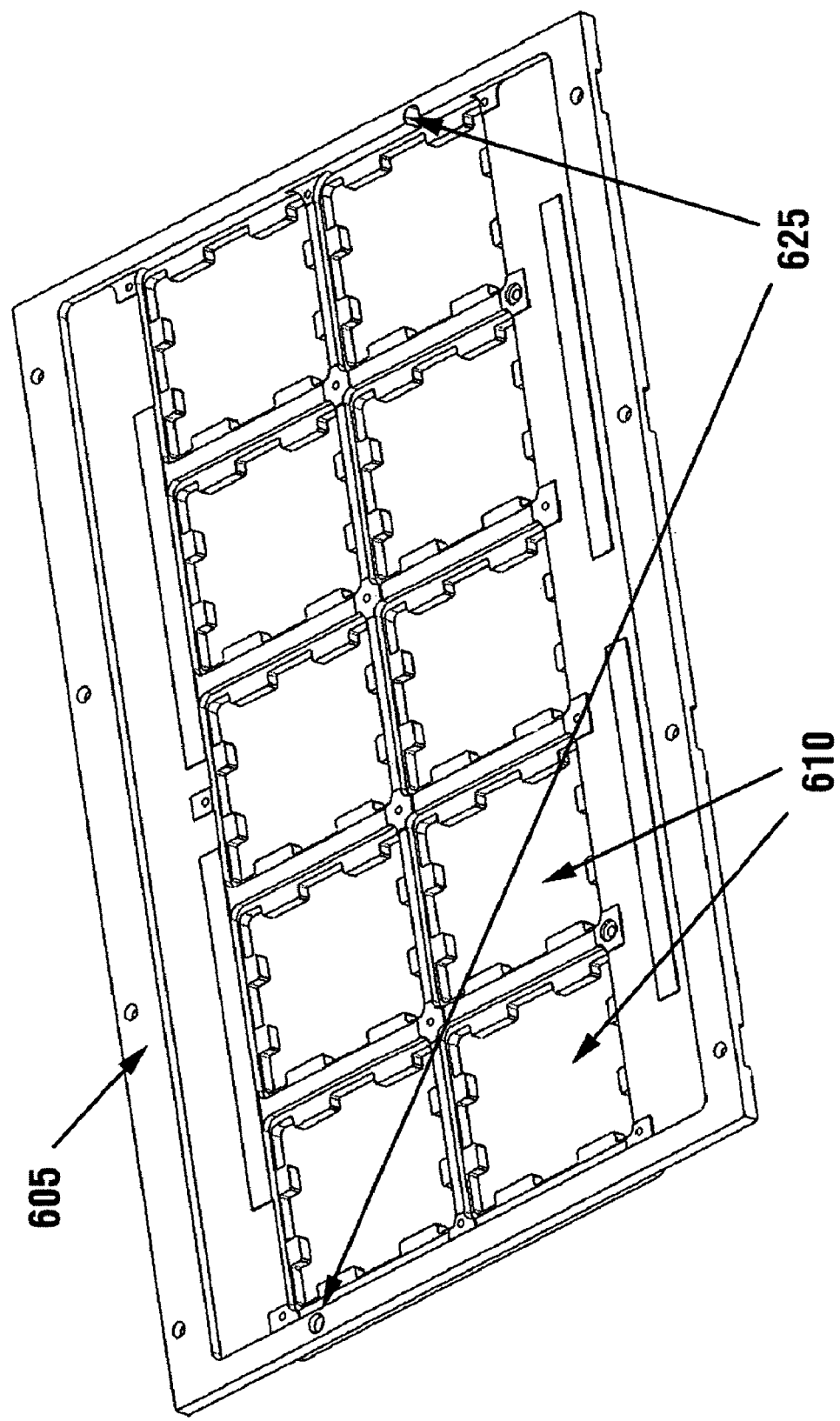
FIG. 16 illustrates an exemplary Pogo Plate in accordance with an embodiment of the invention.

FIG. 16 illustrates an exemplary Pogo Plate in accordance with an embodiment of the invention. Pogo plate 605 is contained in Pogo Kit 600. In the exemplary preferred embodiment, Pogo Plate 605 is configured to accept Pogo Connector blocks 630, configured for OD cards, in openings 610. In other embodiments, the openings 610 may have different sizes and vary in number to match different Pogo Connectors configured for different devices to be tested. Alignment holes 625 engage with alignment pins 520 and 620.

Figure 17:
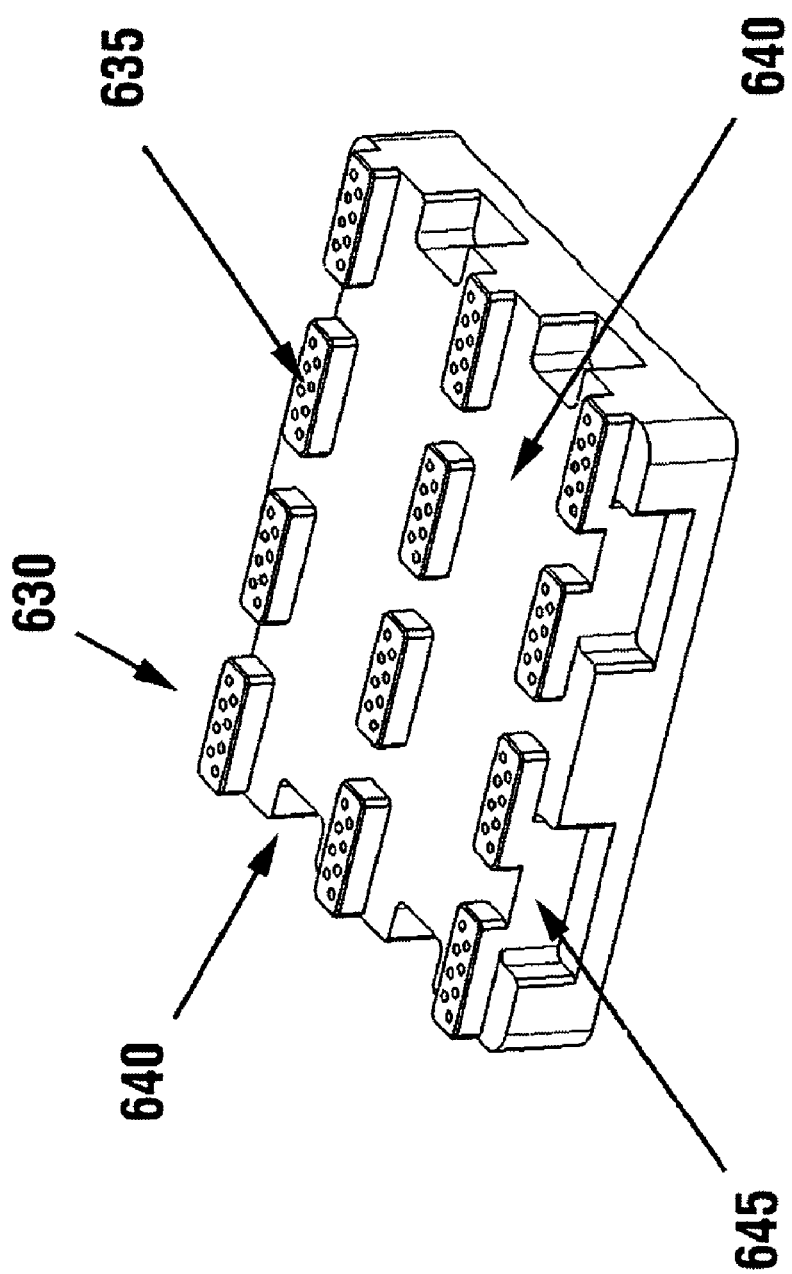
FIG. 17 illustrates and exemplary Pogo Connector block in accordance with an embodiment of the invention.

FIG. 17 illustrates and exemplary Pogo Connector block in accordance with an embodiment of the invention. In the exemplary preferred embodiment, Pogo Connector block 630 comprises a plurality of pogo pin clusters 635 configured for μSD cards. In other embodiments, the number and arrangement of the clusters 635 may vary to match different devices to be tested. The Pogo Connector block 630 comprises notches or slots 640 and 645. These notches match protrusions in openings 610 for alignment of the Pogo Connector block 630 in Pogo Plate 605. In other embodiments these notches may vary in size and or location depending how the connector block is configured for different devices. The preferred embodiment of the instant invention was designed keeping in mind the high importance of Quick Changeover between DUT technologies. The Tray and Pogo Kits are designed such as to allow for a quick change over for different DUT technology test, since machine downtime is very important, as well as leveraging a machine for testing as many device technologies as possible. Only 2 elements need to be changed to do a switch over from testing one type of DUT to another are the Tester Kit (Test Tray +Test Tray Cover), and the Pogo Kit (Pogo Plate +Pogo Board) In other embodiments of the invention changeover kits may be provided for most all DUT technologies including, but not limited to, all kinds of Flash cards including, SD, MMC, MS, CF USB stick, xD. It is further contemplated that changeover kits may be provided for PCB Panels of all sizes up to JEDEC tray size, NAND chips, and NOR chips.

In other embodiments the apparatus may be used with special tray kits to accept PCB panels of various sizes, as long as they fit in the Tray drawer. For small electronic devices, PCBs are manufactured in panels, the components are mounted on them, and then the panels are singulated. Testing the entire panel rater than the singulated devices will achieve significant savings.

In other embodiments, the apparatus may be used for testing Cell Phone or MP3 player, or Digital Camera motherboards, placed as many as they would fit inside the tray. Pogo test kits can be designed specifically for such applications, and may involved digital as well as analogue measurements.

The embodiments of the instant invention were designed keeping also in mind the high importance of low downtime achieved due to modular design. Problems encountered with the system could be fixed by, but not limited to, replacing the entire Pogo Kit+Tester Pack, replacing the Pogo Kit replacing a Pogo Connector Block, replacing a single Pogo Pin, replacing the Pogo Board, replacing the entire Test Pack, replacing only a Test Channel, replacing a CIB board and replacing a test Channel Board.

In an alternative embodiment, the entire apparatus is designed upside down where Tester Pack 510 is at the top and Tray Drawer 430 is on the lower position. Some devices, such as semiconductor die, have pins very close to the periphery. Since the device needs to be held in place by the Test Tray so it won't fall out of the tray through the bottom, the cutout cannot be as large as the device itself, and thus the concept of probing the DUTs from the bottom is problematic. Another embodiment of the presented apparatus is needed to be able to handle such cases. A variation of the design is employed whereas the DUTs are placed in the Test Tray with the contacts facing upwards; the entire system is then designed in an upside down fashion. With the tester pack with the pogo kit will be placed at the top and will have the pogo pins facing downwards. The test drawer will move on the horizontal in the same manner but will be at the lowest position in the Home position. When commencing the Vertical movement, the drawer will move upwards, rather than downwards. The alignment sequence and vertical motion in general will be essentially the same as described above but very much similar In another alternative embodiment, the horizontal motion could be eliminated, Tray could be placed, via a window, at the X-Home position (X position from where the tray is moved only downwards towards the test site. The system would be less friendly but also less costly due to the elimination of the X motion system In an alternative embodiment the Test Kit could be placed vertically on a tray mounting plate that would be moved horizontally towards a test site positioned horizontally, rather than vertically In an alternative embodiment, the Tray Kit could be replaced by using actually only a Test Tray, and implementing a Press that would press down on the DUTs in the tray to stress-relieve the pressure on the cards from the Pogo Pins during testing The apparatus 300 may also be used in conjunction with feeder or sorter systems. A feeder system or other tray transport device may automatically load trays into the apparatus 300. When the semiconductor devices in a Tray for Test have been tested, the Tray for Tests removed from the apparatus 300.

The apparatus 300 supports temperature-controlled testing of semiconductor devices. Fans or air intake/outtake systems may be used to circulate temperature-controlled air into the compartments where the semiconductor devices are located and the test computer 310 is located. A thermostat may be used to monitor the temperature in the first compartments and activate or deactivate air circulation as needed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. For example, while the above embodiments are described in the context of using an μSD card other semiconductor devices may be used. In addition, the above embodiments are described with the apparatus testing one Tray for Test in a Tray Drawer. It is contemplated that the apparatus may be enlarged such that multiple Tray for Tests may be loaded into the Tray Drawer and multiple test Tester Packs arranged to test the multiple Tray for Tests.

The foregoing has described in some detail preferred embodiments of the present invention that have a horizontal DUT test tray motion unlike the vertical test tray motion of prior implementations by the inventor. In many practical applications, this alternative configuration provides significant advantages. However, both approaches leverage a similar novel combination of the DUT test tray and the tester, which includes aspects such as:

the DUT test tray having cutouts in the bottom where the DUT's contact pads come in contact with pogo pins;

a similar motion (e.g., a turn table, which is equivalent to the tray drawer) that goes beyond the test elevation of the tray, leaving the tray near the actual test elevation, which is then reached by the press pushing on the tray or the Spring Cylinder pressing down; and a similar tester pack.

The preferred embodiment of the vertical test tray approach has a moving press that the present horizontal test tray approach does not have (i.e,the press is the tray cover), and vertical test tray approach has a vertical motion design that very different than the present horizontal test tray approach.

The embodiments were chosen and described to best explain the principles of the invention and its practical applications to thereby enable others skilled in the art to best utilize the invention and various embodiments with various modifications as are suited to the particular use contemplated. Moreover, any headings used in the foregoing description are for convenience only and not intended to convey any limitation regarding the embodiments described under any such heading.

Having fully described at least one embodiment of the present invention, other equivalent or alternative apparatus or methods of implementing testing semiconductor devices according to the present invention will be apparent to those skilled in the art. The invention has been described above by way of illustration, and the specific embodiments disclosed are not intended to limit the invention to the particular forms disclosed. The invention is thus to cover all modifications, equivalents, and alternatives falling within the spirit and scope of the following claims.

What is claimed is:

1. An apparatus for testing a plurality of semiconductor devices, the apparatus comprising:

a housing;

a body contained within said housing comprising a first member configured as a drawer to be movable in and out of said housing in a generally horizontal direction;

said first member comprising a receptacle portion having at least one opening in the bottom thereof;

said receptacle portion configured to receive a tray assembly containing the plurality of semiconductor devices having exposed electrical contacts;

said tray assembly comprising a top portion and a bottom portion, said bottom portion comprising a plurality of structures for retaining bottoms of the semiconductor devices in fixed positions, tray openings associated with each of said structures providing access to said electrical contacts and means for securing said top portion to said bottom portion, said top portion comprising a plurality of surfaces on a bottom of said top portion for contacting tops of the semiconductor devices;

a second member for substantially retaining said first member when said first member is in said housing, said second member configured to move said first member in a generally vertical direction within said housing;

a tester pack contained within said housing for receiving said tray assembly when said second member moves said first member proximate said tester pack, said tester pack configured to send and receive electrical signals to the semiconductor devices by way of said electrical contacts; and a test computer in communication with said tester pack where said test computer provides at least one instruction to said tester pack allowing said tester pack to test the semiconductor devices and return test information to said test computer.

2. The apparatus as recited in claim 1, further comprising a stress relief structure on a top of said top portion for dissipating stress relief transferred from the semiconductor devices and means for engaging said securing means.

3. The apparatus as recited in claim 1, further comprising a test pin assembly comprising at least one test pin block comprising a plurality of test pins arranged in a plurality of clusters, said clusters arranged on said block to match said tray openings, a plate for retaining said test pin block, said plate configured for removably attaching to said tester pack and means for electrically connecting said test pins to said tester pack.

4. The apparatus as recited in claim 3, further comprising alignment pins associated with said tester pack for engaging alignment holes associated with said test pin assembly where when said test pin assembly is attached to said tester pack, said connecting means is properly aligned.

5. The apparatus as recited in claim 4, wherein said tester pack sends and receives said electrical signals to the semiconductor devices by way of said test pins contacting said electrical contacts.

6. The apparatus as recited in claim 5, wherein said tray assembly further comprising tray alignment holes for engaging said alignment pins where when said tray assembly is proximate said tester pack, said test pins are in proper alignment with said electrical contacts.

7. The apparatus as recited in claim 1, further comprising a first motorized assembly for moving said first member in said generally horizontal direction and a second motorized assembly for moving said first member in said vertical direction.

8. The apparatus as recited in claim 7, wherein said first motorized assembly comprises a tongue, said first member further comprising a bracket with a slot for engaging said tongue in a manner such that said first motorized assembly uses said tongue for moving said first member and when said second member moves said first member said tongue disengages from said bracket.

9. The apparatus as recited in claim 6, wherein said second member further comprises means for providing a compression force on said top portion of said tray assembly when said test pins are in contact with said electrical contacts.

10. The apparatus as recited in claim 7, wherein said second motorized assembly comprises a single motor connected to a gear for rotating an axel to drive a belt which in turn rotates two lead screws to provide the vertical motion of said second member in a balanced manner.

11. The apparatus as recited in claim 10, wherein when said single motor is stopped, when said test pins are in contact with said electrical contacts, said compression force is maintained.

12. The apparatus as recited in claim 11, wherein said single motor is a stepping motor and adapted for servo control.

13. The apparatus as recited in claim 12, wherein said test computer at least in part controls said first motorized assembly and said second motorized assembly.

14. The apparatus as recited in claim 5, wherein said tester pack is compactly contained within a footprint of said tray assembly whereby a signal length from said electrical contacts to a processor in said tester pack is optimized.

15. An apparatus for testing a plurality of semiconductor devices, the apparatus comprising:

means for housing the apparatus;

means for containing the plurality of semiconductor devices having exposed electrical contacts;

means for receiving said containing means into said housing;

means for testing the plurality of semiconductor devices in said containing means;

means for moving said containing means to said testing means; and means for instructing said testing means to test the semiconductor devices and return test information.

16. The apparatus as recited in claim 15, further comprising means for electrically connecting said testing means to the semiconductor devices.

17. The apparatus as recited in claim 16, further comprising means for aligning said containing means, connecting means and testing means.

18. The apparatus as recited in claim 17, further comprising means for providing a compression force on said containing means when said testing means testing the semiconductor devices.

19. The apparatus as recited in claim 18, further comprising means for maintaining said compression force during the testing.

20. The apparatus as recited in claim 16, further comprising means for optimizing a signal length from said containing means and said testing means.

21. The apparatus as recited in claim 15, further comprising means for controlling said receiving means and said moving means.

22. A method of testing a plurality of semiconductor devices, comprising:

steps for placing a tray assembly containing a plurality of semiconductor devices into a receptacle configured to hold said tray assembly;

steps for moving said receptacle into a housing of one or more test devices;

steps for moving said receptacle to said one or more test devices;

steps for contacting electrical contacts of each of said semiconductor devices with an electrical interface electrically connected to said one or more test devices;

steps for applying force to said tray assembly, thereby securing said tray assembly to said electrical interface; and steps for performing one or more tests on the semiconductor devices.

23. The method as recited in claim 22, further comprising steps for retrieving information from said one or more tests.

* * * * *